United States Patent
Miyahara

(10) Patent No.: US 8,242,004 B2
(45) Date of Patent: Aug. 14, 2012

(54) SEMICONDUCTOR DEVICE AND METHOD OF FABRICATING THE SAME

(75) Inventor: Jiro Miyahara, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 53 days.

(21) Appl. No.: 13/026,758

(22) Filed: Feb. 14, 2011

(65) Prior Publication Data
US 2011/0201173 A1 Aug. 18, 2011

(30) Foreign Application Priority Data

Feb. 18, 2010 (JP) ................ 2010-033673

(51) Int. Cl.
*H01L 21/20* (2006.01)
(52) U.S. Cl. ........ 438/496; 438/431; 438/432; 438/761; 438/778; 438/782; 438/787; 257/626; 257/632; 257/634; 257/E33.06; 257/E31.119; 257/E23.077; 257/E23.131; 257/E21.487; 257/E21.54
(58) Field of Classification Search .......... 438/430–432, 438/496, 761, 778, 782, 787; 257/626, 632, 257/634, E33.06, E31.119, E23.077, E23.131, E21.487, E21.54
See application file for complete search history.

(56) References Cited

U.S. PATENT DOCUMENTS

| 6,972,262 B2 * | 12/2005 | Lee et al. ............... 438/706 |
| 2006/0102977 A1 * | 5/2006 | Fucsko et al. ............. 257/499 |
| 2010/0200544 A1 * | 8/2010 | Terasaki et al. ............. 216/41 |

FOREIGN PATENT DOCUMENTS

JP  2009-081377  4/2009

* cited by examiner

*Primary Examiner* — Charles Garber
*Assistant Examiner* — Yasser Abdelaziez
(74) *Attorney, Agent, or Firm* — Young & Thompson

(57) ABSTRACT

A method of forming a semiconductor device includes the following processes. A groove is formed in a semiconductor substrate. A first spin-on-dielectric layer is formed over a semiconductor substrate. An abnormal oxidation of the first spin-on-dielectric layer is carried out. A surface of the first spin-on-dielectric layer is removed. A second spin-on-dielectric layer is formed over the first spin-on-dielectric layer. A non-abnormal oxidation of the first and second spin-on-dielectric layers is carried out to modify the second spin-on-dielectric layer without modifying the first spin-on-dielectric layer.

20 Claims, 23 Drawing Sheets dielectric layer to form a space in the trench, the space being positioned under the second spin-on-dielectric layer. A conductor is formed in the space.
SEMICONDUCTOR DEVICE AND METHOD OF FABRICATING THE SAME

BACKGROUND OF THE INVENTION

1. Field of the Invention

The present invention relates to a semiconductor device and a method of fabricating the same.

Priority is claimed on Japanese Patent Application No. 2010-033673, Feb. 18, 2010, the content of which is incorporated herein by reference.

2. Description of the Related Art

In recent years, as semiconductor devices have been shrunken, short channel effects have been serious where the length of a channel of a transistor is shorter than a predetermined length, for example, a length that allows transistors to perform stable operations. Such short channel effects make it difficult for the semiconductor devices to stably and normally operate.

To solve this problem, there is a proposal for a semiconductor device in which a vertical transistor is used, which includes a pillar. The pillar can be formed by processing the surface of a semiconductor substrate. This is disclosed in Japanese Unexamined Patent Application, First Publication, No. JP-A-2009-081377.

In the semiconductor device disclosed in Japanese Unexamined Patent Application, First Publication, No. JP-A-2009-081377, a plurality of pillars are disposed at varying intervals over the semiconductor substrate. The intervals vary in transverse and longitudinal directions in plan view. The semiconductor device includes word lines. The word line includes gate electrodes. The word line extends to contact with the plurality of pillars. Further, a plurality of crossing trenches are formed for forming the plurality of pillars defined by the plurality of crossing trenches. An insulating layer fills the plurality of crossing trenches.

SUMMARY

In one embodiment, a method of forming a semiconductor device may include, but is not limited to, the following processes. A first spin-on-dielectric layer is formed over a semiconductor substrate. An abnormal oxidation of the first spin-on-dielectric layer is carried out. A surface of the first spin-on-dielectric layer is removed. A second spin-on-dielectric layer is formed over the first spin-on-dielectric layer. A non-abnormal oxidation of the first and second spin-on-dielectric layers is carried out to modify the second spin-on-dielectric layer without modifying the first spin-on-dielectric layer.

In another embodiment, a method of forming a semiconductor device may include, but is not limited to, the following processes. A trench is formed in a semiconductor substrate. A first spin-on-dielectric layer is formed in the trench. An abnormal oxidation of the first spin-on-dielectric layer is carried out. A surface of the first spin-on-dielectric layer is removed. A second spin-on-dielectric layer is formed over the first spin-on-dielectric layer. A non-abnormal oxidation of the first and second spin-on-dielectric layers is carried out to modify the second spin-on-dielectric layer without modifying the first spin-on-dielectric layer. The first spin-on-dielectric layer is removed without removing the second spin-on-dielectric layer to form a space in the trench, the space being positioned under the second spin-on-dielectric layer. A conductor is formed in the space.

In still another embodiment, a method of forming a semiconductor device may include, but is not limited to, the following processes. A trench is formed in a semiconductor substrate. A bit contact is formed on a side surface of the trench, the bit contact including a first impurity element. A bit line is formed in the trench. A first spin-on-dielectric layer is formed over the bit line in the trench. An abnormal oxidation of the first spin-on-dielectric layer is carried out. A surface of the first spin-on-dielectric layer is removed. A second spin-on-dielectric layer in contact with the first spin-on-dielectric layer is formed. A non-abnormal oxidation of the first and second spin-on-dielectric layers is carried out to modify the second spin-on-dielectric layer without modifying the first spin-on-dielectric layer. The first spin-on-dielectric layer is removed without removing the second spin-on-dielectric layer to form a space, the space being positioned under the second spin-on-dielectric layer. A conductor is formed in the space. A second impurity element is introduced to a surface of the semiconductor substrate, the second impurity element being the same in conductivity type as the first impurity element.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

Figure 1:
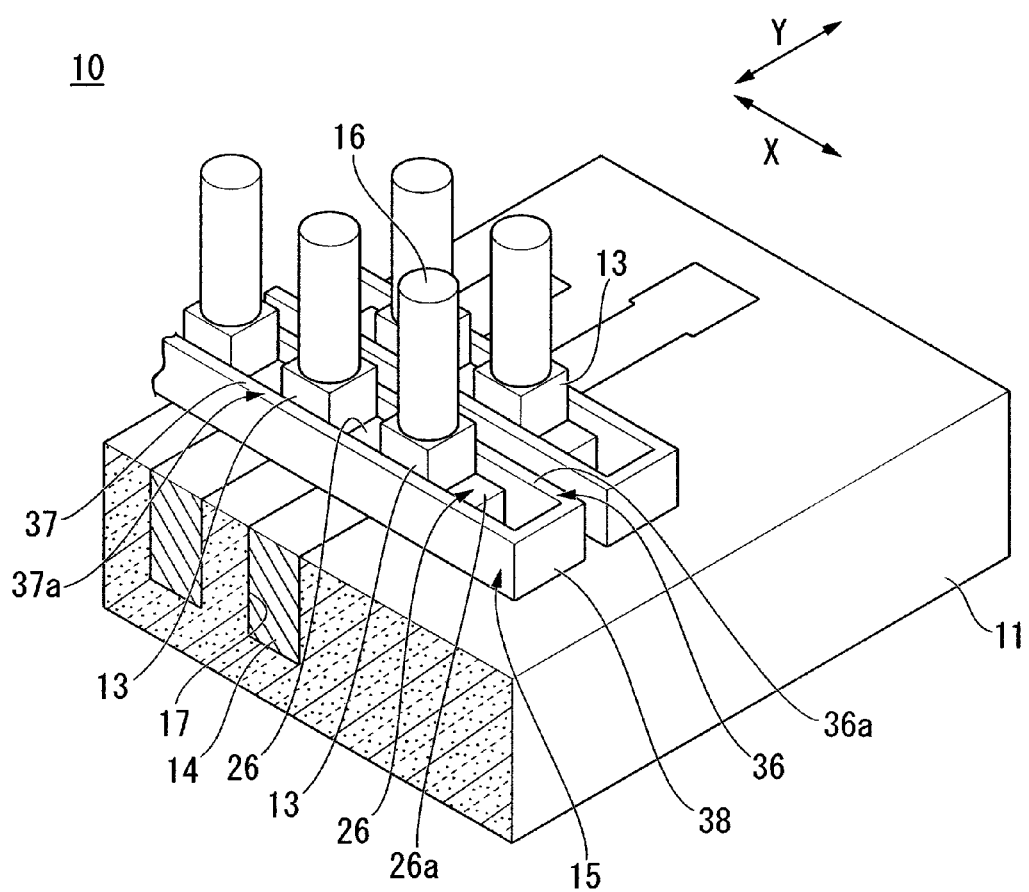
FIG. 1 is a fragmentary perspective view illustrating a memory cell region of a semiconductor device in accordance with one embodiment of the present invention.

Before describing the present invention, the related art will be explained in detail, in order to facilitate the understanding of the present invention.

The semiconductor device including the vertical transistors has a small occupied area of the surface of a semiconductor substrate. The semiconductor device can realize the $4F^2$ type layout where F is the dimension of the design rule which depends on the resolution limit of an advanced exposure equipment. Further, if the channel region of the semiconductor device is designed to be completely depleted when the transistor is in an OFF state, the semiconductor device can obtain an adequate reduction of the OFF current. Accordingly, the vertical transistor is effectively applicable for shrinkage of semiconductor memory devices such as dynamic random access memory (DRAM).

The semiconductor device disclosed in Japanese Unexamined Patent Application, First Publication, No. JP-A-2009-081377 has a poor gap-filling property where the insulating layer fills gaps or trenches between the pillars. The poor gap-filling property is remarkable when the film quality of the gap-filling insulating layer is low. Voids in the gap-filling insulating layer may form an undesired short circuit.

Embodiments of the invention will be now described herein with reference to illustrative embodiments. Those skilled in the art will recognize that many alternative embodiments can be accomplished using the teaching of the embodiments of the present invention and that the invention is not limited to the embodiments illustrated for explanatory purpose.

In one embodiment, a method of forming a semiconductor device may include, but is not limited to, the following processes. A first spin-on-dielectric layer is formed over a semiconductor substrate. An abnormal oxidation of the first spin-on-dielectric layer is carried out. A surface of the first spin-on-dielectric layer is removed. A second spin-on-dielectric layer is formed over the first spin-on-dielectric layer. A non-abnormal oxidation of the first and second spin-on-dielectric layers is carried out to modify the second spin-on-dielectric layer without modifying the first spin-on-dielectric layer.

In some cases, the method may further include, but is not limited to, removing the first spin-on-dielectric layer.

In some cases, the method may further include, but is not limited to, carrying out a wet-etching process to etch the first and second spin-on-dielectric layers, wherein the first spin-on-dielectric layer is etched at a first etching rate, the second spin-on-dielectric layer is etched at a second etching rate, and the first etching rate is greater than the second etching rate.

In some cases, the method may include, but is not limited to, the following steps. The abnormal oxidation is carried out at a first temperature. The non-abnormal oxidation is carried out at a second temperature lower than the first temperature.

In some cases, the method may include, but is not limited to, the first temperature being equal to or higher than 550° C. and the second temperature being lower than 550° C.

In some cases, carrying out the abnormal oxidation may include, but is not limited to, carrying out the abnormal oxidation with steam. Further, carrying out the abnormal oxidation may include, but is not limited to, carrying out the non-abnormal oxidation with steam.

In some cases, carrying out the abnormal oxidation may include, but is not limited to, supplying an oxidation process gas and diluting the oxidation process gas to stop the abnormal oxidation.

In some cases, carrying out the non-abnormal oxidation may include, but is not limited to, supplying an oxidation process gas and diluting the oxidation process gas to stop the non-abnormal oxidation.

In another embodiment, a method of forming a semiconductor device may include, but is not limited to, the following processes. A trench is formed in a semiconductor substrate. A first spin-on-dielectric layer is formed in the trench. An abnormal oxidation of the first spin-on-dielectric layer is carried out. A surface of the first spin-on-dielectric layer is removed. A second spin-on-dielectric layer is formed over the first spin-on-dielectric layer. A non-abnormal oxidation of the first and second spin-on-dielectric layers is carried out to modify the second spin-on-dielectric layer without modifying the first spin-on-dielectric layer. The first spin-on-dielectric layer is removed without removing the second spin-on-dielectric layer to form a space in the trench, the space being positioned under the second spin-on-dielectric layer. A conductor is formed in the space.

In some cases, removing the first spin-on-dielectric layer may include, but is not limited to, carrying out a wet-etching process to etch the first and second spin-on-dielectric layers, wherein the first spin-on-dielectric layer is etched at a first etching rate, the second spin-on-dielectric layer is etched at a second etching rate, and the first etching rate is greater than the second etching rate.

In some cases, the method may include, but is not limited to, the following processes. The abnormal oxidation is carried out at a first temperature. The non-abnormal oxidation is carried out at a second temperature lower than the first temperature.

In some cases, the method may include, but is not limited to, the first temperature being equal to or higher than 550° C. and the second temperature being lower than 550° C.

In some cases, carrying out the abnormal oxidation may include, but is not limited to, carrying out the abnormal oxidation with steam. Further, carrying out the abnormal oxidation may include, but is not limited to, carrying out the non-abnormal oxidation with steam.

In some cases, carrying out the non-abnormal oxidation may include, but is not limited to, supplying an oxidation process gas and diluting the oxidation process gas to stop the non-abnormal oxidation.

In still another embodiment, a method of forming a semiconductor device may include, but is not limited to, the following processes. A trench is formed in a semiconductor substrate. A bit contact is formed on a side surface of the trench, the bit contact including a first impurity element. A bit line is formed in the trench. A first spin-on-dielectric layer is formed over the bit line in the trench. An abnormal oxidation of the first spin-on-dielectric layer is carried out. A surface of the first spin-on-dielectric layer is removed. A second spin-on-dielectric layer in contact with the first spin-on-dielectric layer is formed. A non-abnormal oxidation of the first and second spin-on-dielectric layers is carried out to modify the second spin-on-dielectric layer without modifying the first spin-on-dielectric layer. The first spin-on-dielectric layer is removed without removing the second spin-on-dielectric layer to form a space, the space being positioned under the second spin-on-dielectric layer. A conductor is formed in the space. A second impurity element is introduced to a surface of the semiconductor substrate, the second impurity element being the same in conductivity type as the first impurity element.

In some cases, the method may include, but is not limited to, the following processes. The abnormal oxidation is carried out at a first temperature. The non-abnormal oxidation is carried out at a second temperature lower than the first temperature.

In some cases, the method may include, but is not limited to, the first temperature being equal to or higher than 550° C. and the second temperature being lower than 550° C.

In some cases, carrying out the abnormal oxidation may include, but is not limited to, carrying out the abnormal oxidation with steam. Further, carrying out the abnormal oxidation may include, but is not limited to, carrying out the non-abnormal oxidation with steam.

In some cases, removing the first spin-on-dielectric layer may include, but is not limited to, carrying out a wet-etching process to etch the first and second spin-on-dielectric layers, wherein the first spin-on-dielectric layer is etched at a first etching rate, the second spin-on-dielectric layer is etched at a second etching rate, and the first etching rate is greater than the second etching rate.

Hereinafter, a semiconductor device according to an embodiment of the invention will be described in detail with reference to the drawings. In the embodiment, the semiconductor device is a DRAM (Dynamic Random Access Memory), but should not be limited to the DRAMs. In the drawings used for the following description, to easily understand characteristics, there is a case where characteristic parts are enlarged and shown for convenience' sake, and ratios of constituent elements may not be the same as in reality. Materials, sizes, and the like exemplified in the following description are just examples. The embodiment is not limited thereto and may be appropriately modified within a scope which does not deviate from the concept of the invention.

Embodiment

Figure 2:
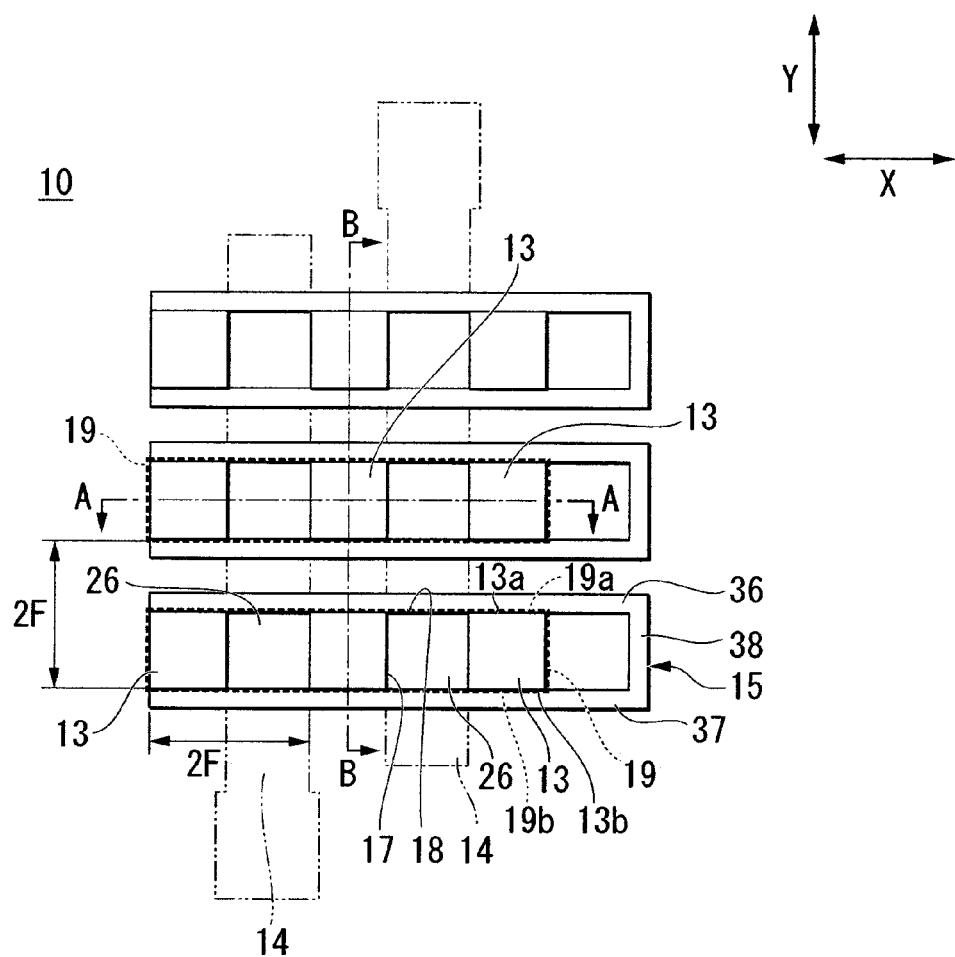
FIG. 2 is a fragmentary plain view illustrating the semiconductor device in accordance with one embodiment of the present invention.

FIG. 1 is a schematic perspective view showing a memory cell region of a semiconductor device according to an embodiment of the present invention. FIG. 2 is a schematic plan view of the semiconductor device shown in FIG. 1. In FIGS. 1 and 2, a memory cell region of a dynamic random access memory (DRAM) as one example of a semiconductor device 10 is shown. Further, FIGS. 1 and 2 illustrate a positional relationship of pillars 13, bit lines 14, and word lines 15, but not all elements of the semiconductor device.

There will be simply described, with reference to FIGS. 1 and 2, the positional relationship of a plurality of pillars 13, bit lines 14, word lines 15, and capacitors 16, which are formed over a semiconductor substrate 11 included in the semiconductor device 10. Then, a cross-sectional structure of the memory cell region of the semiconductor device 10 will be described with reference to FIGS. 3 and 4.

Referring to FIGS. 1 and 2, the semiconductor device 10 may include, but is not limited to, the plurality of pillars 13, the bit lines 14, the word lines 15, and the capacitors 16.

The plurality of pillars 13 are protrusions that are formed by processing a plurality of first trenches 17 and a plurality of second trenches 18 on a surface of the semiconductor substrate 11. The plurality of first trenches 17 extend in a Y direction, i.e. a first direction and a plurality of second trenches 18, which extend in an X direction, i.e. a second direction. The plurality of pillars 13 are surrounded by the first and second trenches 17 and 18.

As shown in FIG. 2, the plurality of pillars 13 disposed in the X direction constitute one pillar group 19. This pillar group 19 is provided in plural numbers.

The plurality of pillars 13 are disposed in both the X direction and the Y direction in a matrix form with a pitch of 2F where F is the dimension of the design rule set on the basis of the resolution limit of the advanced exposure equipment. In other words, the plurality of pillars 13 are disposed with a 4F$^2$ type layout. The plurality of pillars 13 may each have a shape of, for instance, a quadrilateral column. Hereinafter, the case in which the plurality of pillars 13 in the shape of a quadrilateral column are provided will be described as an example.

The bit lines 14 are buried in the first trenches 17 formed on the semiconductor substrate 11 and extending in the Y direction. The bit lines 14 are electrically insulated from the semiconductor substrate 11.

The word lines 15 are provided above the bit lines 14. The word lines 15 are electrically insulated from the bit lines 14. The word lines 15 are formed, which extend in the X direction. Thus, when viewed from the top, the bit lines 14 and the word lines 15 intersect with each other at substantially right angles. Further, the word lines 15 will be described in detail with reference to FIGS. 1 through 3.

Figure 3:
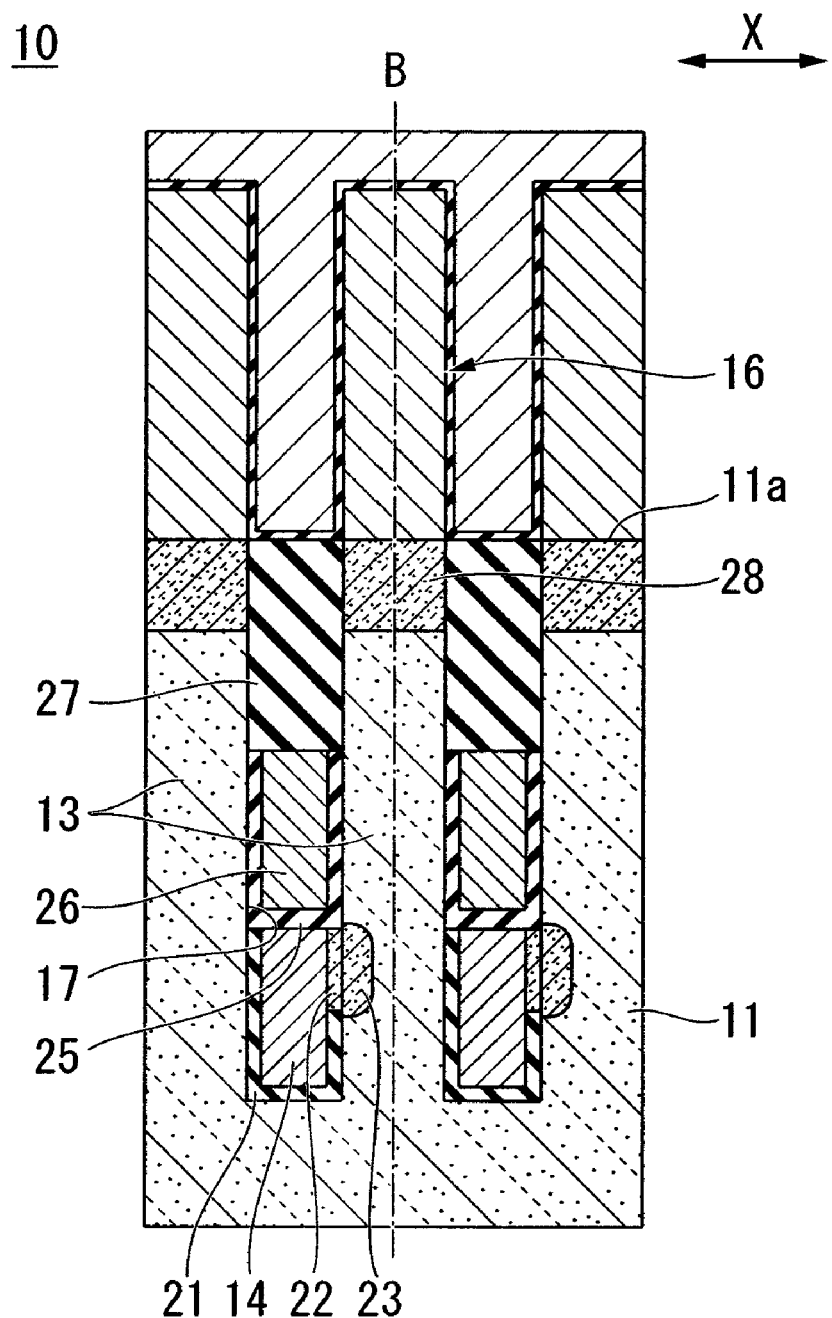
FIG. 3 is a fragmentary cross sectional elevation view, taken along an A-A line of FIG. 2, illustrating the semiconductor device of FIGS. 1 and 2.

Each capacitor 16 is provided on an upper impurity diffusion region 28 disposed on an upper surface of a pillar 13 as shown in FIG. 3.

Figure 4:
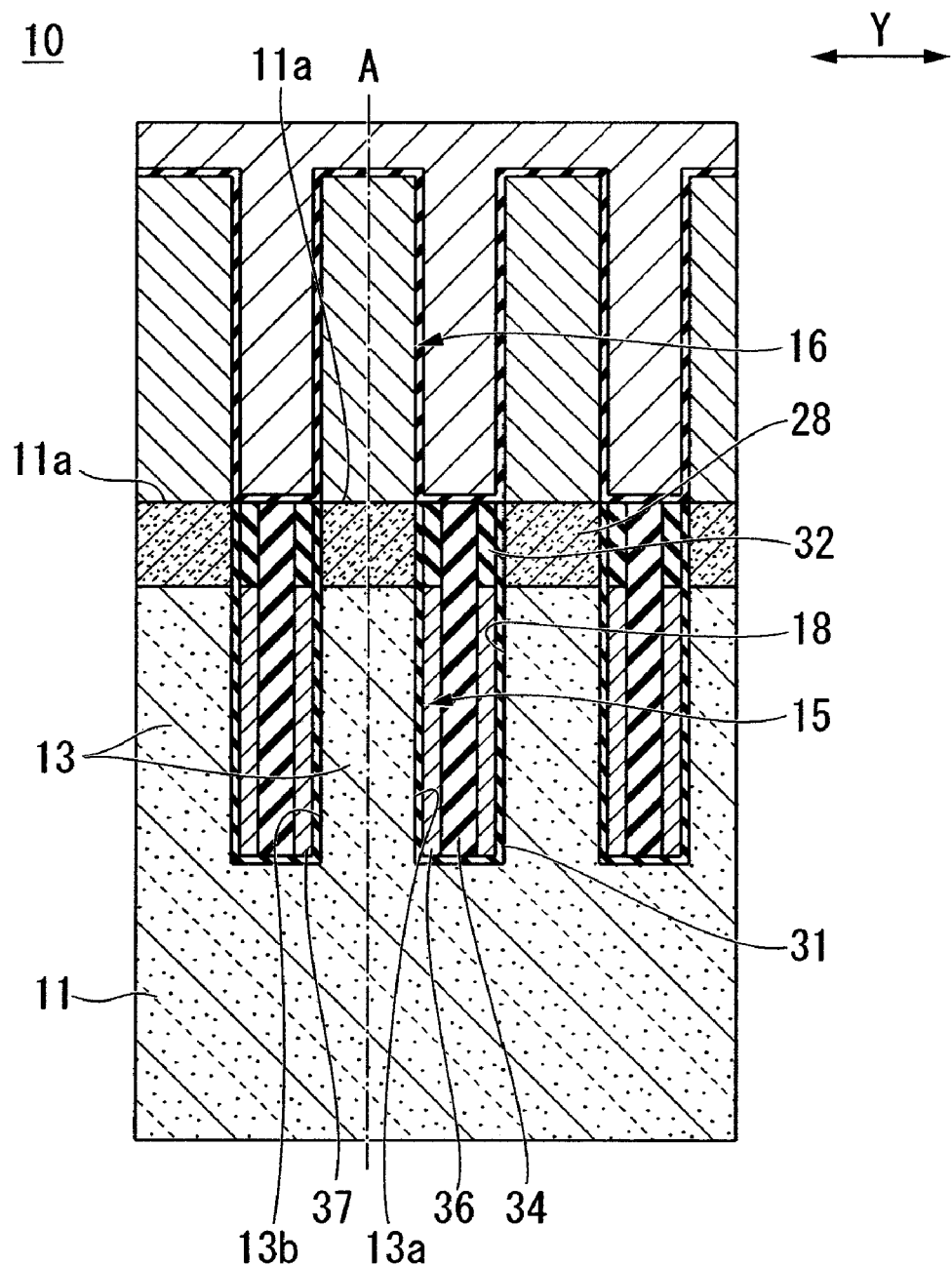
FIG. 4 is a fragmentary cross sectional elevation view, taken along a B-B line of FIG. 2, illustrating the semiconductor device of FIGS. 1 and 2.

FIG. 3 is a schematic cross-sectional view taken along line A-A of the semiconductor device shown in FIG. 2. FIG. 4 is a schematic cross-sectional view taken along line B-B of the semiconductor device shown in FIGS. 1 and 2. In FIGS. 3 and 4, the same numerals are used to indicate the same elements as the semiconductor device 10 shown in FIG. 2.

Here, the structure of the semiconductor device 10 will be described with reference to FIGS. 3 and 4.

First, the elements of the semiconductor device 10 will be described with reference to FIG. 3, and then to FIG. 4.

Referring to FIG. 3, as described above, the semiconductor device 10 includes the semiconductor substrate 11, the plurality of pillars 13, the bit lines 14, the word lines 15, the capacitors 16, the first trenches 17, and the second trenches 18. In addition, the semiconductor device 10 may further include, but is not limited to, third insulating layers 21, bit contacts 22, lower impurity diffusion regions 23, liner layers 25 that are fourth insulating layers, connection parts 26, second insulating layers 27, and an upper impurity diffusion region 28.

The third insulating layers 21 are provided, which cover lower portions of the first trenches 17 corresponding to formation regions of the bit lines 14, except for formation regions of the bit contacts 22. The third insulating layers 21 are layers for insulating the bit lines 14 from the semiconductor substrate 11.

The bit contacts 22 are each provided on one inner wall of the lower portion of each of the first trenches 17. The bit contact 22 is in contact with a lower portion of a side surface of the pillar 13. The bit contact 22 contains the same impurities of first conductivity type as that of the lower impurity diffusion region 23. The first conductivity-type may be N-type. An example of the first conductivity-type impurities may be As.

The lower impurity diffusion regions 23 are formed in the pillars 13. The lower impurity diffusion region 23 has a surface which is a part of the side surface of the pillar 13. The bit contact 22 is in contact with the lower impurity diffusion region 23. The bit contact 22 is on the part of the side surface of the pillar 13. The lower impurity diffusion regions 23 are formed at lower portions of the pillars 13. The lower impurity diffusion regions 23 perform as source regions or drain regions.

As illustrated in FIGS. 1 and 2, the bit lines 14, the bit contacts 22, and the third insulating layers 21 are disposed in lower portions of the first trenches 17. The third insulating layer 21 covers bottom and side inner surfaces of the lower portion of the first trench 17. The bit contact 22 is adjacent to or in contact with the lower impurity diffusion region 23. The bit line 14 is in contact with the third insulating layer 21 and the bit contact 22. The third insulating layer 21, the bit contact 22, and the bit line 14 fill the lower portion of the first trench 17. Thereby, the bit lines 14 are electrically connected to the lower impurity diffusion regions 23 via the bit contacts 22.

The liner layers 25 are disposed in middle portions of the first trenches 17. The second spin-on-dielectric (SOD) layers 27 are disposed in upper portions of the first trenches 17. The liner layers 25 are each provided so as to cover the side surfaces of the first trench 17. The liner layer 25 is interposed between the bit line 14 and the second spin-on-dielectric (SOD) layer 27. The liner layers 25 also cover upper surfaces of the bit line 14, the third insulating layer 21, and the bit contact 22. The liner layers 25 electrically insulate the bit lines 14 from the connection parts 26. As the liner layer 25, for example, a silicon nitride layer (e.g. a $Si_3N_4$ layer) may be used.

The connection parts 26 are formed in the first trenches 17, in each of which the liner layer 25 is formed. As shown in FIG. 2, each connection part 26 is provided between first and second gate electrodes 36 and 37, which will be described later, and electrically connects the first gate electrode 36 and the second gate electrode 37. A plurality of connection parts 26 are provided between the first and second gate electrodes 36 and 37. The connection parts 26 are united with the word line 15.

The plurality of connection parts 26 are provided to electrically connect the first gate electrode 36 and the second gate electrode 37, so that, even when thicknesses of the first and second gate electrodes 36 and 37 are small, a resistance value of the word line 15 can be reduced.

Thereby, it is possible to normally operate the memory cell disposed at a position apart from a drive circuit (not shown) of the word lines 15. As such, it is possible to dispose vertical metal oxide semiconductor (MOS) transistors with a $4F^2$ type layout.

Further, as the resistance value of the word line 15 is reduced, it is possible to lengthen the first and second gate electrodes 36 and 37, and thus it is possible to achieve high integration of the semiconductor device 10.

Referring to FIG. 3, the second insulating layer 27 is provided in the first trench 17. The second insulating layer 27 is interposed between the capacitor 16 and the connection part 26. The second insulating layer 27 is a layer that is modified so as to prevent abnormal oxidation of an SOD layer which may be a coating insulating layer. The coating insulating layer is formed by a spinner method. The coating insulating layer is better in the gap-filling property than other insulating layers. The word "abnormal oxidation" may typically refer to a process causing a phenomenon that a surface of the SOD layer is modified while an inner part of the SOD layer is not modified. A typical example of the abnormal oxidation may be, but is not limited to, a thermal oxidation at a high temperature. Here, the SOD layer performing as the second insulating layer 27 is modified in its entirety or the majority thereof.

In this way, the SOD layer is better in the gap-filling property than other insulating layers. The SOD layer performs as the second insulating layer 27. The SOD layer is buried in the first trench 17 located above the connection part 26. The SOD layer in the first trench 17 suppresses generation of voids (not shown) in the second insulating layer 27 that is interposed between the capacitor 16 and the connection part 26. Such voids of the second insulating layer 27 may cause a short circuit formation. The short circuit formation can be prevented by using the SOD layer in the first trench 17.

As a material of the SOD layer which will be modified to be the second insulating layer 27, for example, polysilazane may be used. Polysilazane is a polymer material that is also referred to as a silazane-type polymer that has a —($SiH_2$—NH)— group as an elementary unit. When used, polysilazane is dissolved in a solvent such as xylene, di-n-butylether, or the like. The SOD layer of polysilazane is a layer that is modified by steam oxidation at a temperature of 400° C. or higher.

The upper impurity diffusion region 28 is formed on the upper surface of the plurality of pillars 13. The upper impurity diffusion region 28 is formed by doping, into the upper surfaces of the pillars 13, the same impurities of first conductivity-type as those of the lower impurity diffusion regions 23. The upper impurity diffusion region 28 performs as a source region or a drain region.

Further, an upper surface of the upper impurity diffusion region 28 is a surface that corresponds to the surface 11a of the semiconductor substrate 11 that has not been processed.

Here, the structure of the capacitor 16 shown in FIG. 3 will be described. Referring to FIG. 3, the capacitor 16 includes a sequential stack of a lower electrode, a dielectric layer, and an upper electrode. The capacitor 16 is formed on the upper impurity diffusion region 28. The lower electrode is electrically connected to the upper impurity diffusion region 28.

Meanwhile, a contact plug (not shown) may be provided between the capacitor 16 and the upper impurity diffusion region 28. The capacitor 16 may be electrically connected with the upper impurity diffusion region 28 via the contact plug. Further, the structure of the capacitor 16 is not limited to the structure shown in FIG. 3.

Referring to FIG. 4, as described above, the semiconductor device 10 includes the word lines 15 which have the positional relationship to the bit lines 14. The positional relationship has been described with reference to FIGS. 1 and 2. The semiconductor device 10 may further include, but is not limited to, gate insulating layers 31, sidewall layers 32, and fifth insulating layers 34.

Each gate insulating layer 31 is formed so as to cover side surfaces and a bottom surface of the second trench 18. Here, the side surfaces of the second trench 18 refer to side surfaces 13a and 13b of the pillar 13 and the side surfaces of the upper impurity diffusion region 28. The upper impurity diffusion region 28 is formed on the pillar 13. The side surfaces of the upper impurity diffusion region 28 are disposed on the same planes as the side surfaces 13a and 13b of the pillar 13.

Here, the structure of the word line 15 will be described with reference to FIGS. 1, 2 and 4.

As shown in FIGS. 1 and 2, the word line 15 includes the first gate electrode 36, the second gate electrode 37, and connection parts 38.

Referring to FIGS. 1, 2 and 4, the first gate electrode 36 is in contact with the gate insulating layer 31 formed on a first side surface 19a of the pillar group 19. Additionally, the first gate electrode 36 is positioned lower than the upper impurity diffusion region 28 as shown in FIG. 2. Thereby, the first gate electrode 36 is electrically insulated from the semiconductor substrate 11 and the pillars 13.

Here, the first side surface 19a of the pillar group 19 is a surface constructed by the side surfaces 13a of the plurality of pillars 13.

Referring to FIGS. 1, 2 and 4, the second gate electrode 37 is in contact with the gate insulating layer 31 formed on a second side surface 19b, i.e. a side surface located on the opposite side of the first side surface 19a of the pillar group 19, of the pillar group 19. Further, the first gate electrode 36 is positioned lower than the upper impurity diffusion region 28 as shown in FIG. 2. Thereby, the second gate electrode 37 is electrically insulated from the semiconductor substrate 11 and the pillars 13.

Here, the second side surface 19b of the pillar group 19 is a surface constructed by the side surfaces 13b of the plurality of pillars 13.

Referring to FIGS. 1 and 2, the connection parts 38 are provided at ends of the first and second gate electrodes 36 and 37, and are electrically connected with the first gate electrode 36 and the second gate electrode 37. The connection parts 38 are united with the first and second gate electrodes 36 and 37. The connection parts 38 are electrically connected with a drive circuit (not shown) that applies a predetermined potential to the first and second gate electrodes 36 and 37.

As shown in FIG. 1, upper surfaces 36a and 37a of the first and second gate electrodes 36 and 37 are disposed at a higher position than the upper surface 26a of the connection part 26.

In this manner, as the upper surfaces 36a and 37a of the first and second gate electrodes 36 and 37 constituting the word line 15 are disposed above the upper surface 26a of the connection part 26, the first and second gate electrodes 36 and 37 are in contact with the entirety of the surface of the connection part 26, i.e., the surface of the connection part 26 which is opposite to the first and second gate electrodes 36 and 37. Also, the first and second gate electrodes 36 and 37 are increased in cross-sectional area. As such, the resistance value of the word line 15 can be reduced.

The sidewall layers 32 will be described with reference to FIG. 4. The sidewall layers 32 are in contact with the gate oxide layers 31 formed in the second trench 18. Also, the sidewall layers 32 are disposed above the positions where the first and second gate electrodes 36 and 37 are formed.

Each fifth insulating layer 34 is disposed so as to fill the second trench 18 in which the first and second gate electrodes 36 and 37 and the sidewall layers 32 are formed.

According to the semiconductor device of the present embodiment, the SOD layer, which is better in gap-filling properties other insulating layers as the material of the second insulating layer 27, is formed over the connection part 26 formed in the first trench 17. By virtue of this, void (not shown) is suppressed to be generated in the second insulating layer 27 that is interposed between the capacitor 16 and the connection part 26. Hence, it is possible to prevent a short circuit caused by the void of the second insulating layer 27.

Figure 19:
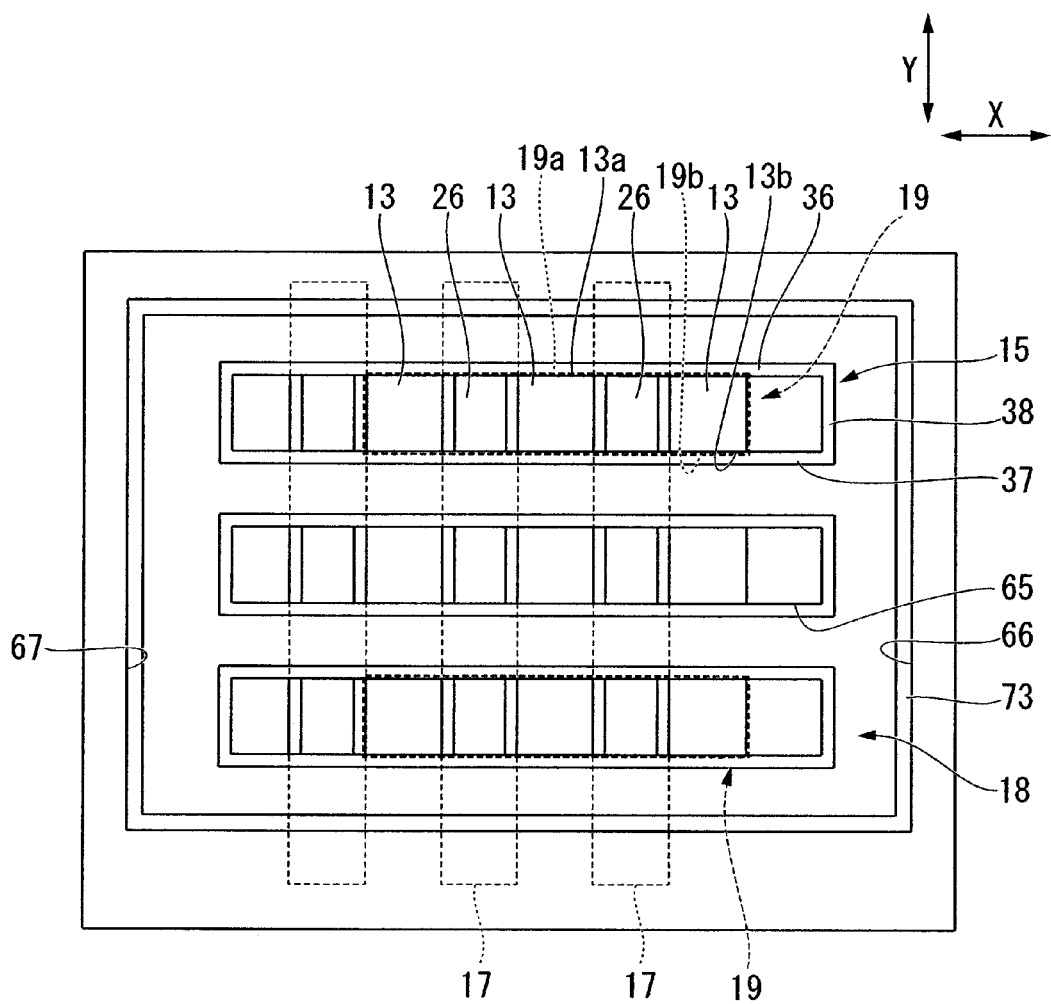
FIG. 19 a plain view of a structure shown in FIG. 18.

Further, the second trench 18 may be shaped as shown in FIG. 19 which will be described below, and a dummy pattern 73 (see FIG. 19) having a shape of a frame when viewed from the top may be formed on the outermost circumference of the second trench 18.

The dummy pattern 73 is an interconnection layer that does not contribute to the operation of the vertical transistor. When such a dummy pattern is formed in order to prevent the malfunction of a circuit, the dummy pattern 73 can be set to a fixed potential such as an earth potential when the semiconductor device 10 operates.

Figure 7:
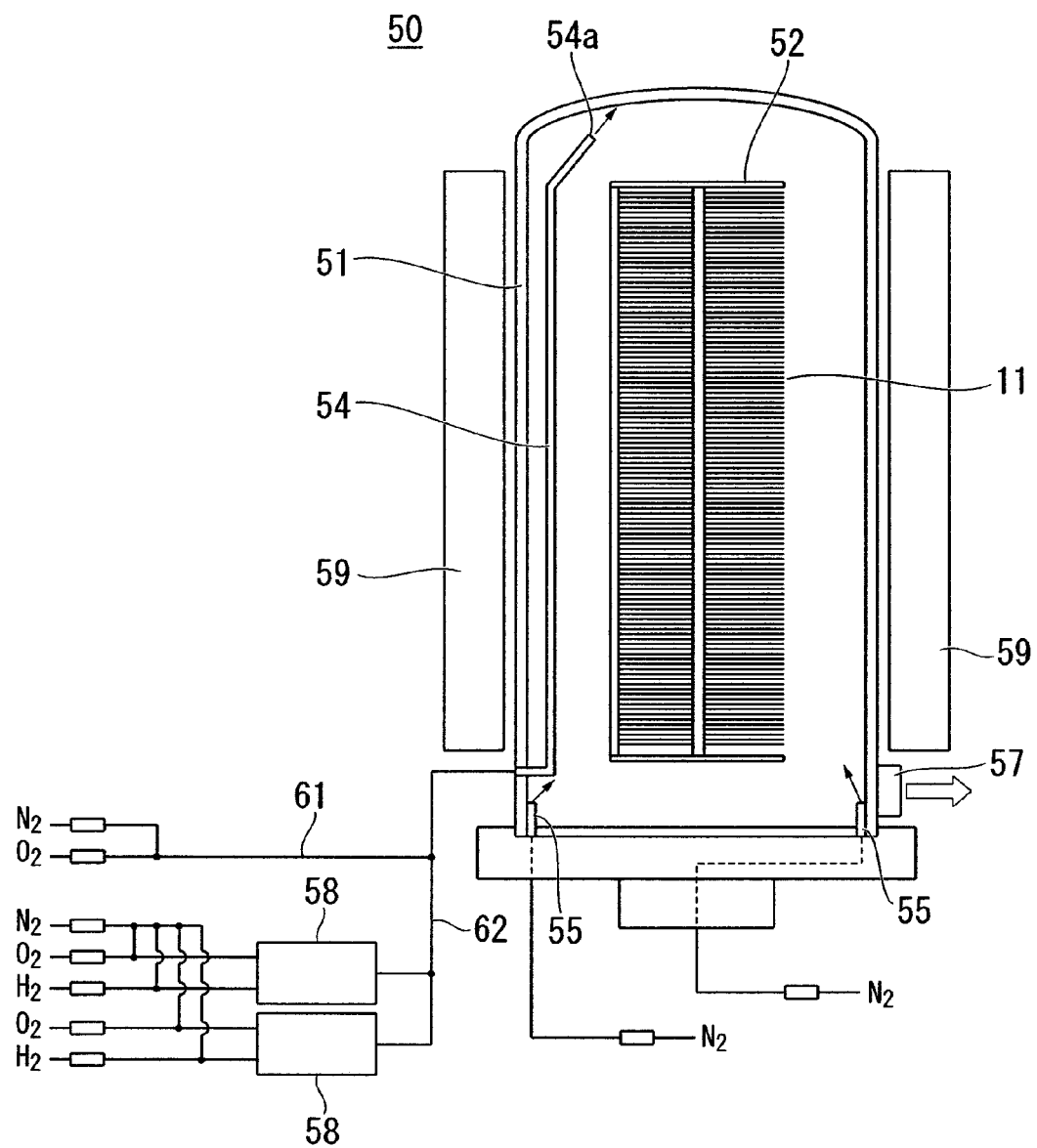
FIG. 7 is a cross sectional elevation view illustrating a diffusion furnace used in a step of heat treatment of an SOD layer.
Figure 8:
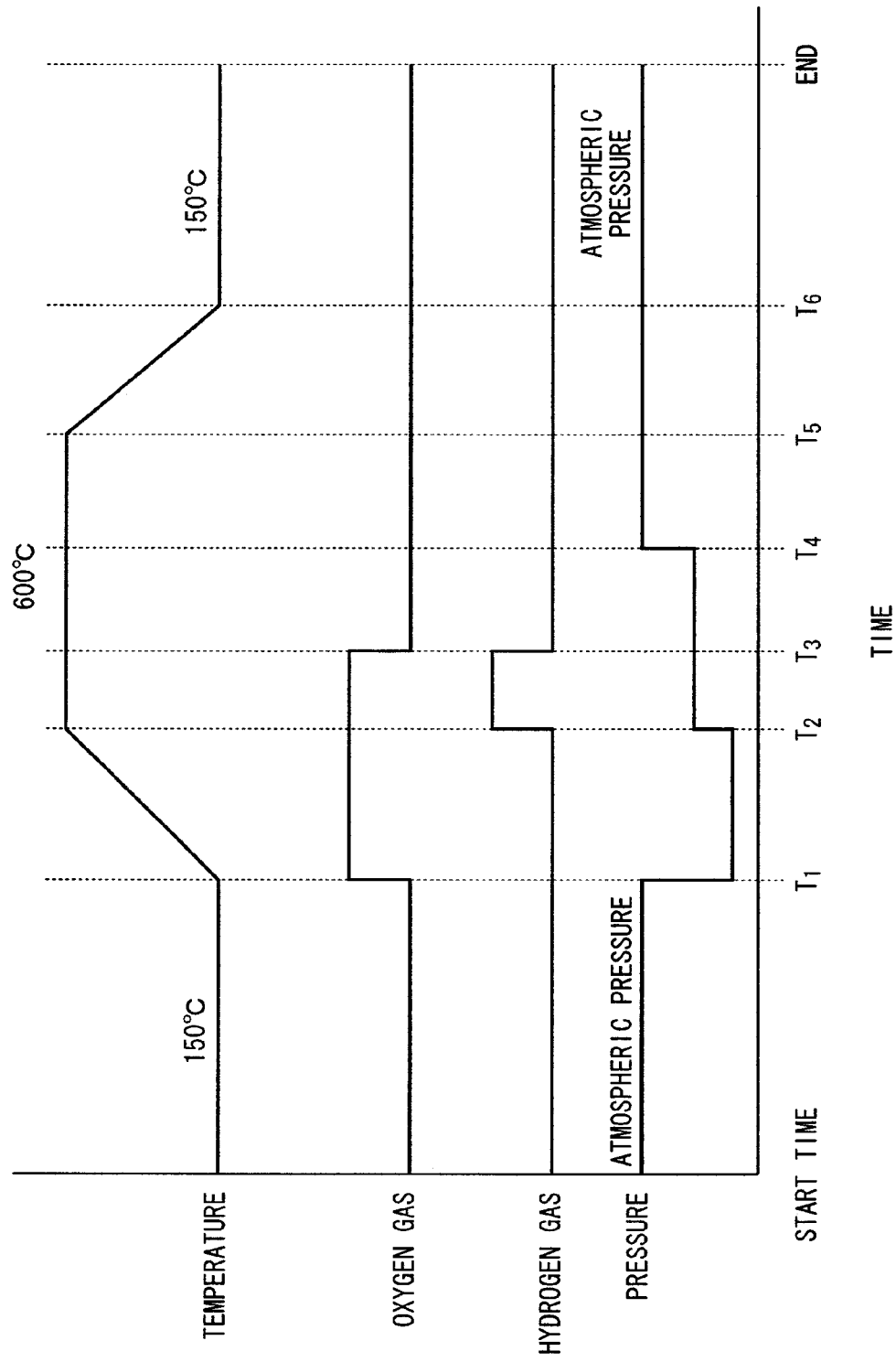
FIG. 8 is a timing chart of supplying gas in a first modifying process, a first modification stopping process, and a first annealing process.
Figure 10:
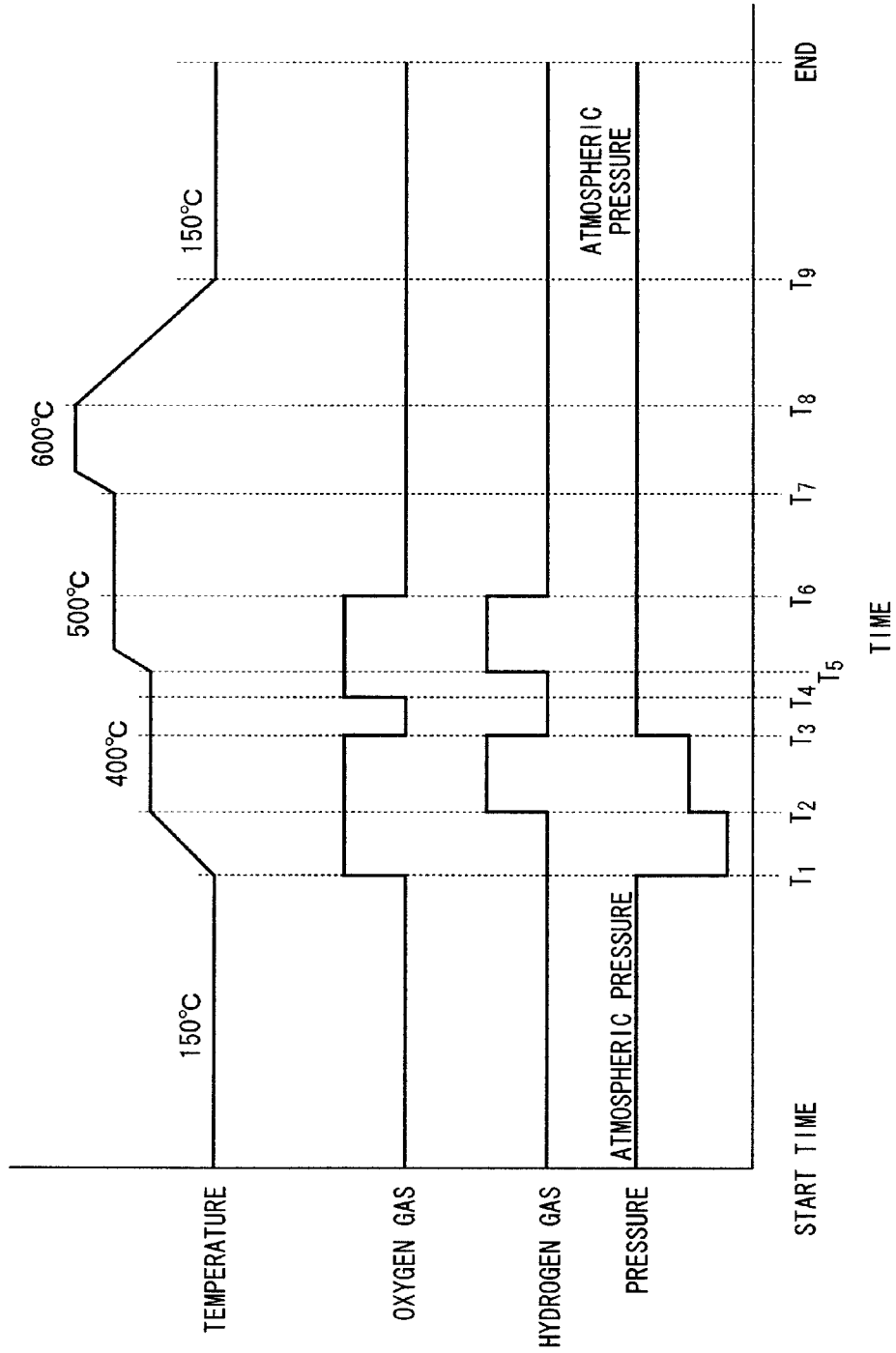
FIG. 10 is a timing chart of supplying gas in a second modifying process, a second modification stopping process, and a second annealing process.
Figure 11:
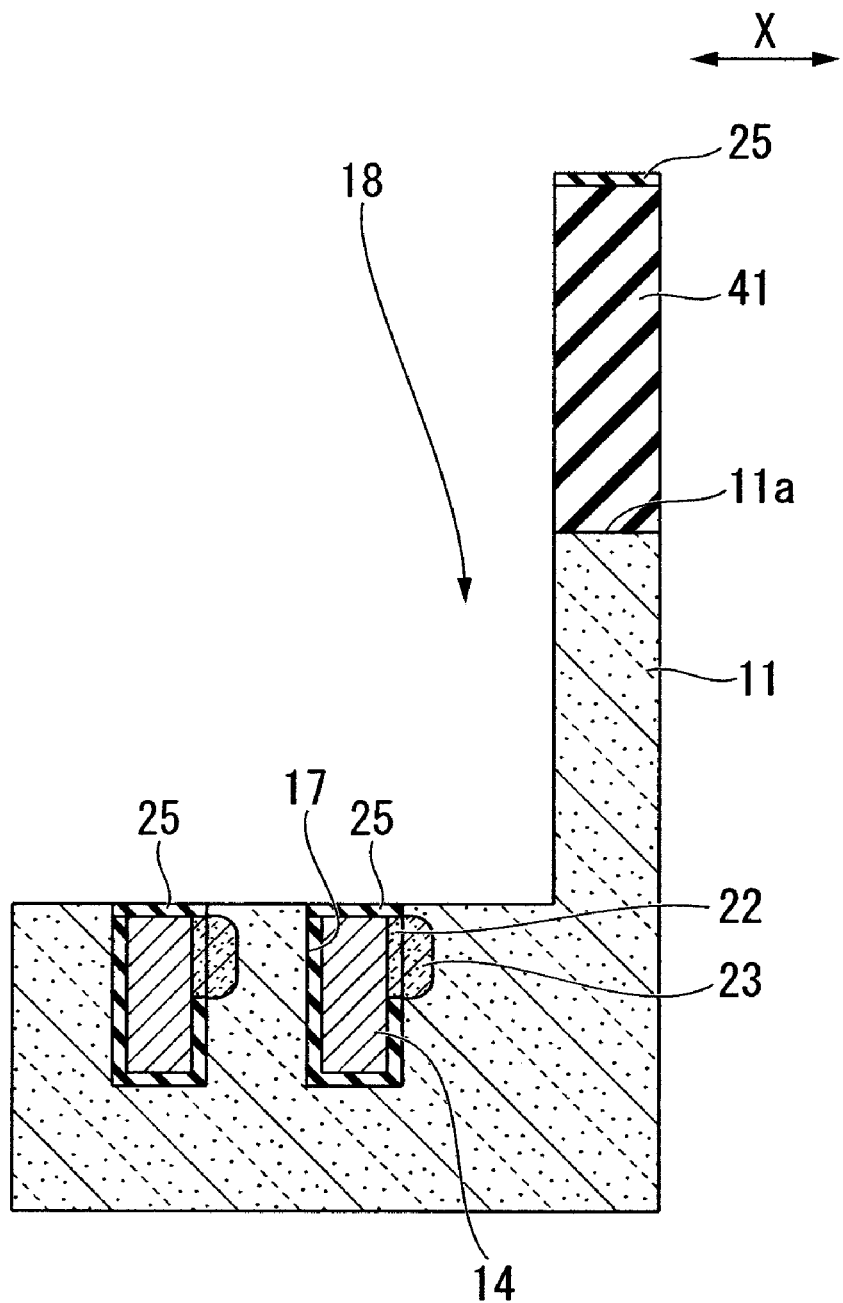
FIG. 11 is a fragmentary cross sectional elevation view, taken along an C-C line of FIG. 12, the semiconductor device in a step, subsequent to the step of FIG. 9, involved in the method of forming the semiconductor device of FIGS. 1 and 2.
Figure 12:
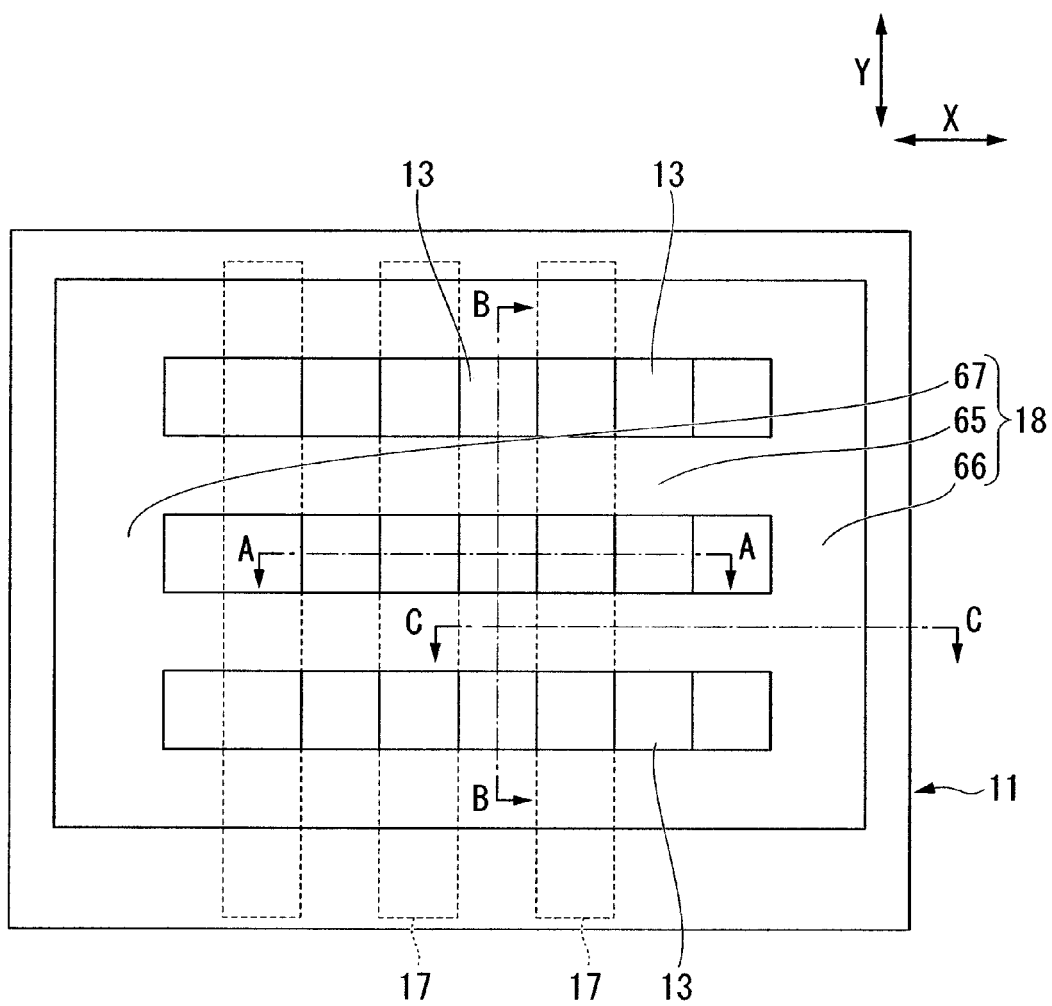
FIG. 12 is a plain view of a structure shown in FIG. 11.
Figure 14:
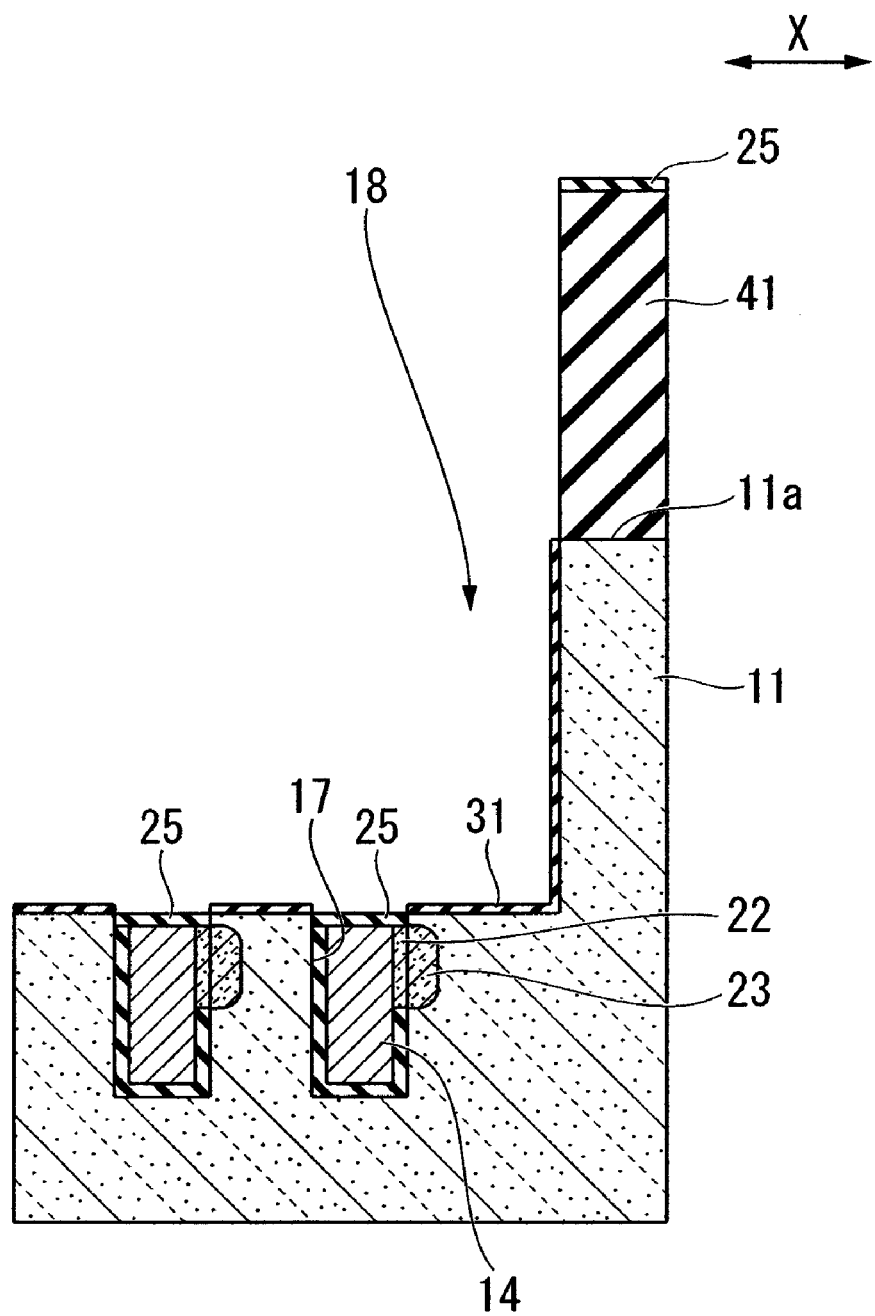
FIG. 14 a fragmentary cross sectional elevation view, taken along an C-C line of FIG. 12, the semiconductor device in a step, subsequent to the step of FIG. 13, involved in the method of forming the semiconductor device of FIGS. 1 and 2.
Figure 15:
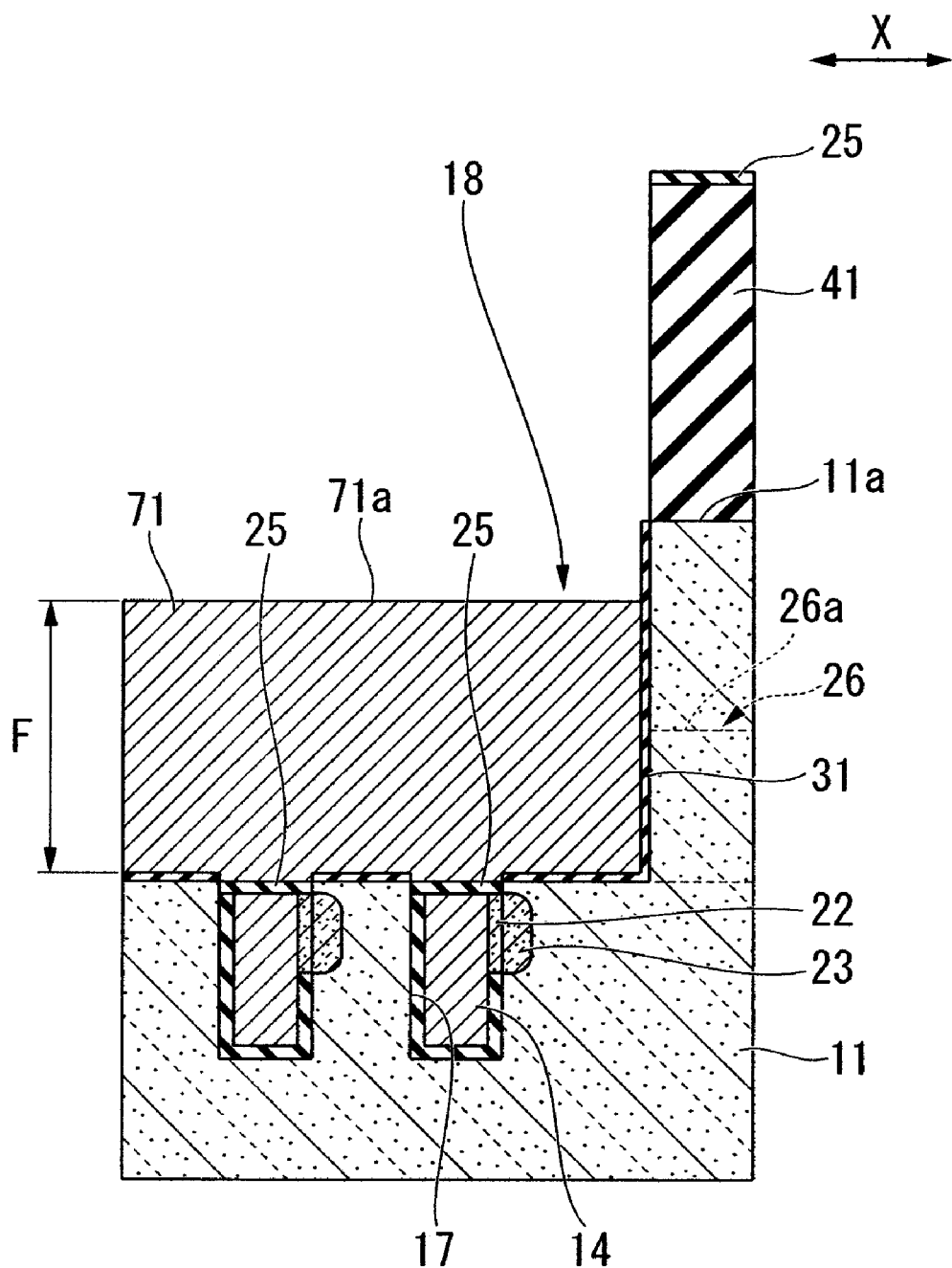
FIG. 15 a fragmentary cross sectional elevation view, taken along an C-C line of FIG. 12, the semiconductor device in a step, subsequent to the step of FIG. 14, involved in the method of forming the semiconductor device of FIGS. 1 and 2.
Figure 16:
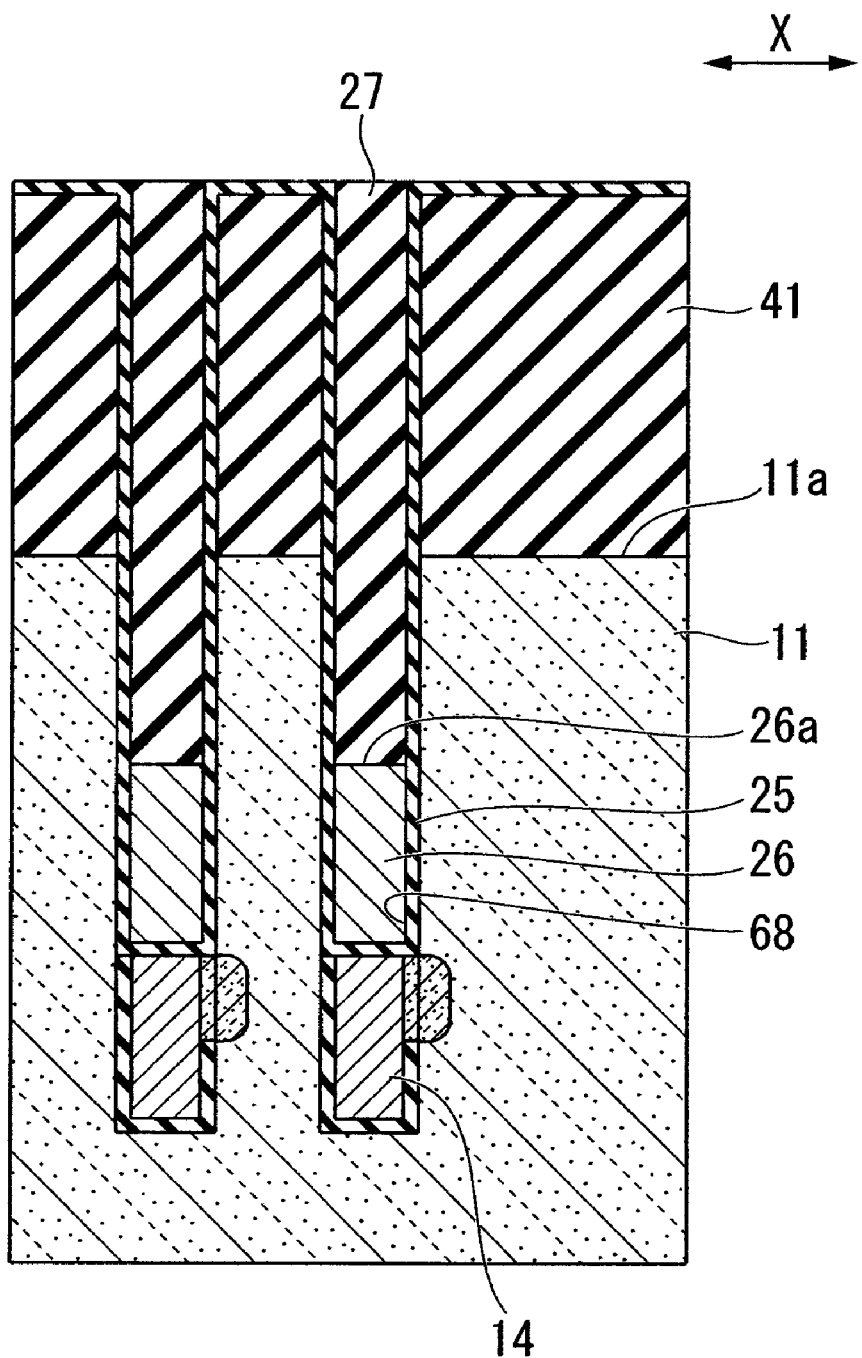
FIG. 16 is a fragmentary cross sectional elevation view, taken along an A-A line of FIG. 2, the semiconductor device in a step, subsequent to the step of FIG. 15, involved in the method of forming the semiconductor device of FIGS. 1 and 2.

A process of fabricating the semiconductor device will be described with reference to FIGS. 5, 6, 9, 11, 13, 14, 15, 17, 18, 20 and 21 in addition to FIGS. 7, 8, 10, 12, 16, and 19. FIGS. 5, 6, 9, 11, 13, 14, 15, 17, 18, 20 and 21 are cross-sectional views illustrating the semiconductor devices in steps involved in the process of fabricating the semiconductor device of FIG. 3. FIG. 7 is a schematic cross-sectional view showing a diffusion furnace used when heat treatment is performed on an SOD layer. FIG. 8 is a timing chart of supplying gas in a first modifying process, a first modification stopping process, and a first annealing process. FIG. 10 is a timing chart of supplying gas in a second modifying process, a second modification stopping process, and a second annealing process. FIG. 12 is a schematic plan view of the structure shown in FIG. 11. FIG. 16 is a schematic cross-sectional view showing a semiconductor device in which a conductive layer is formed while being fabricated. FIG. 19 is a schematic plan view of the structure shown in FIG. 18.

FIGS. 5, 6, 9, 13 and 16 are fragmentary cross sectional elevation views taken along line A-A of FIG. 2. FIGS. 11, 14 and 15 are fragmentary cross sectional elevation views taken along line C-C of the structure shown in FIG. 12. FIGS. 17, 18, 20 and 21 are fragmentary cross sectional elevation views taken along line B-B of FIGS. 2 and 12.

Further, not all components are shown in FIG. 11 so as to clearly illustrate the positional relationship of the first trenches 17, the second trenches 18, and the pillars 13. Furthermore, in FIGS. 5 through 21, the same numerals are used to indicate the same elements as the semiconductor device 10 shown in FIGS. 1 through 4.

The method of fabricating the semiconductor device according to the present embodiment will be described with reference to FIGS. 5 through 21.

Figure 5:
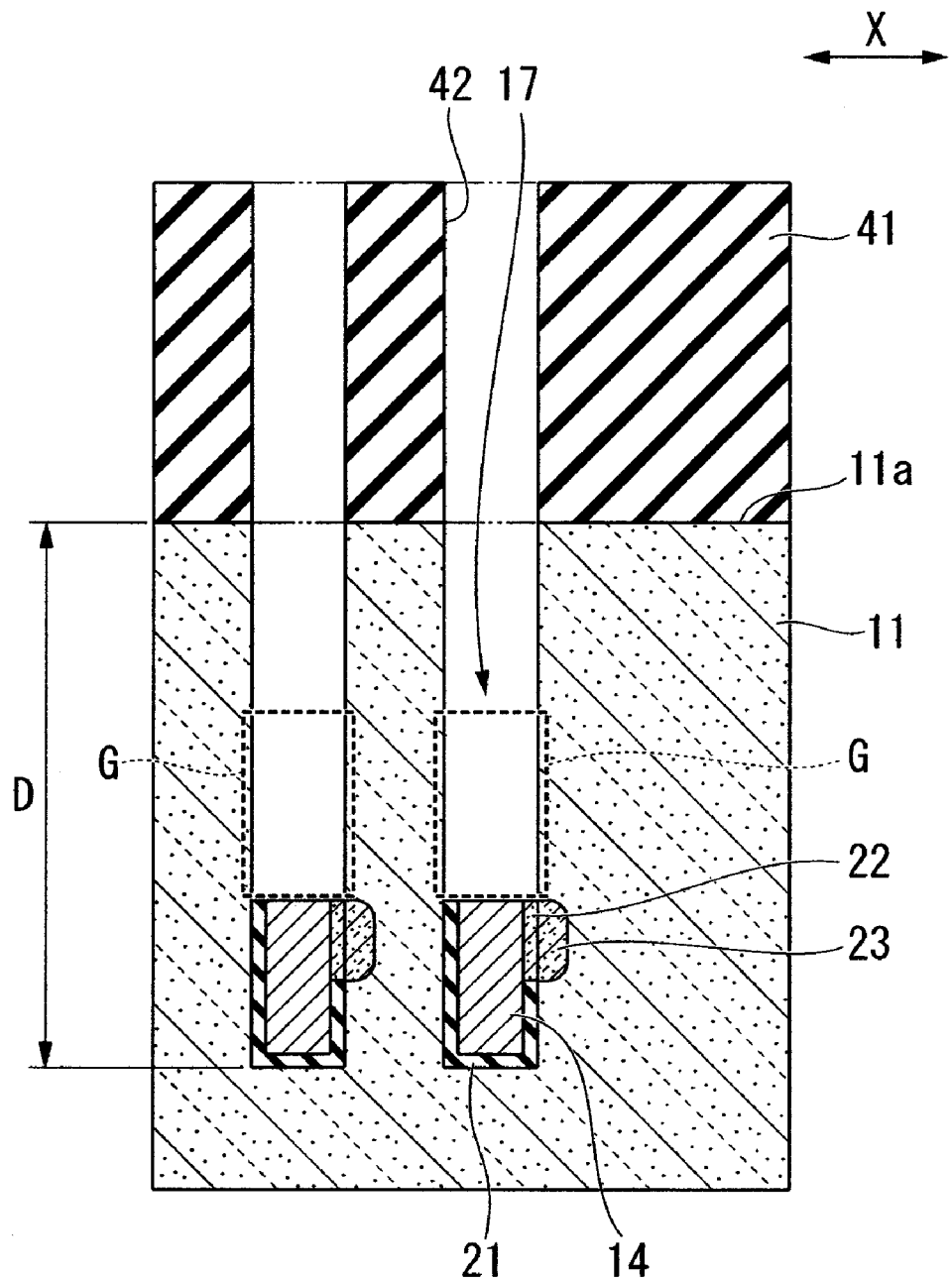
FIG. 5 is a fragmentary cross sectional elevation view, taken along an A-A line of FIG. 2, illustrating the semiconductor device in a step involved in the method of forming the semiconductor device of FIGS. 1 and 2.

First, in the process shown in FIG. 5, a hard mask layer 41 is formed on the surface 11a of the semiconductor substrate 11. The hard mask layer 41 has openings 42 that reach the surface 11a of a semiconductor substrate 11 and correspond to formation regions of the first trenches 17.

As the semiconductor substrate 11, for example, a P-type silicon wafer may be used. Further, as the hard mask layer 41, for example, a silicon nitride layer (particularly, a $Si_3N_4$ layer) may be used.

The semiconductor substrate 11 is etched using the hard mask layer 41 by anisotropic etching (e.g. dry etching), thereby forming a plurality of first trenches 17 (first trench forming process).

The first trenches 17 are formed so as to extend in a Y direction (first direction), as shown in FIG. 2 that has been previously described. The first trench 17 has a high aspect ratio.

The first trench 17 may be formed with a depth D of, for instance, 250 nm from the surface 11a of the semiconductor substrate 11. Further, a width of the first trench 17 and an interval between the first trenches 17 may be, for instance, 45 nm.

Subsequently, a third insulating layer 21 (e.g. a $SiO_2$ layer) is formed to cover side surfaces and bottom surface of the first trench 17. Then, opening (not shown) is formed in the third insulating layer 21, thereby exposing one of the side surfaces of the first trench 17 which correspond to formation region of bit contact 22.

Then, the bit contact 22 containing a first conductivity-type impurity is formed on a side surface of the semiconductor substrate 11 which correspond to the formation regions of bit contact 22 using a known method (bit contact forming process).

The bit contact 22 is formed so as to pass through the third insulating layer 21. As the bit contact 22, for example, a polysilicon layer doped with an N-type impurity element (e.g. As) as the first conductivity-type impurity may be used.

A bit line 14 is formed in a lower portion of the first trench 17 where the third insulating layer 21 and the bit contact 22 are formed (bit line forming process).

In detail, the first trench 17 is filled with a stacked layer, in which a titanium (Ti) layer, a titanium nitride (TiN) layer, and a tungsten (W) layer are sequentially stacked, by, for example, a chemical vapor deposition (CVD) method, and then the stacked layer is etched-back, thereby forming the bit line 14.

At this time, the N-type impurity element (e.g. As) which is the first conductivity-type impurity and is contained in the bit contact 22 is diffused into the semiconductor substrate 11 by heating when the stacked layer is formed by CVD equipment. As such, the lower impurity diffusion region 23 is formed on one side surface of the first trench 17 (lower impurity diffusion region forming process).

Afterwards, the third insulating layer 21 located above the bit line 14 is removed.

Meanwhile, the third insulating layer forming process (i.e. the process of forming the third insulating layer 21) includes the following processes. The third insulating layer 21, for example, the $SiO_2$ layer, covering the side surfaces and bottom surface of the aforementioned first trench 17 is formed. Then, an opening (not shown), which reaches one of the side surfaces of the first trench 17 which corresponds to the formation region of the bit contact 22, is formed in the third insulating layer 21. The third insulating layer 21 that is located above the bit line 14 is removed.

Figure 6:
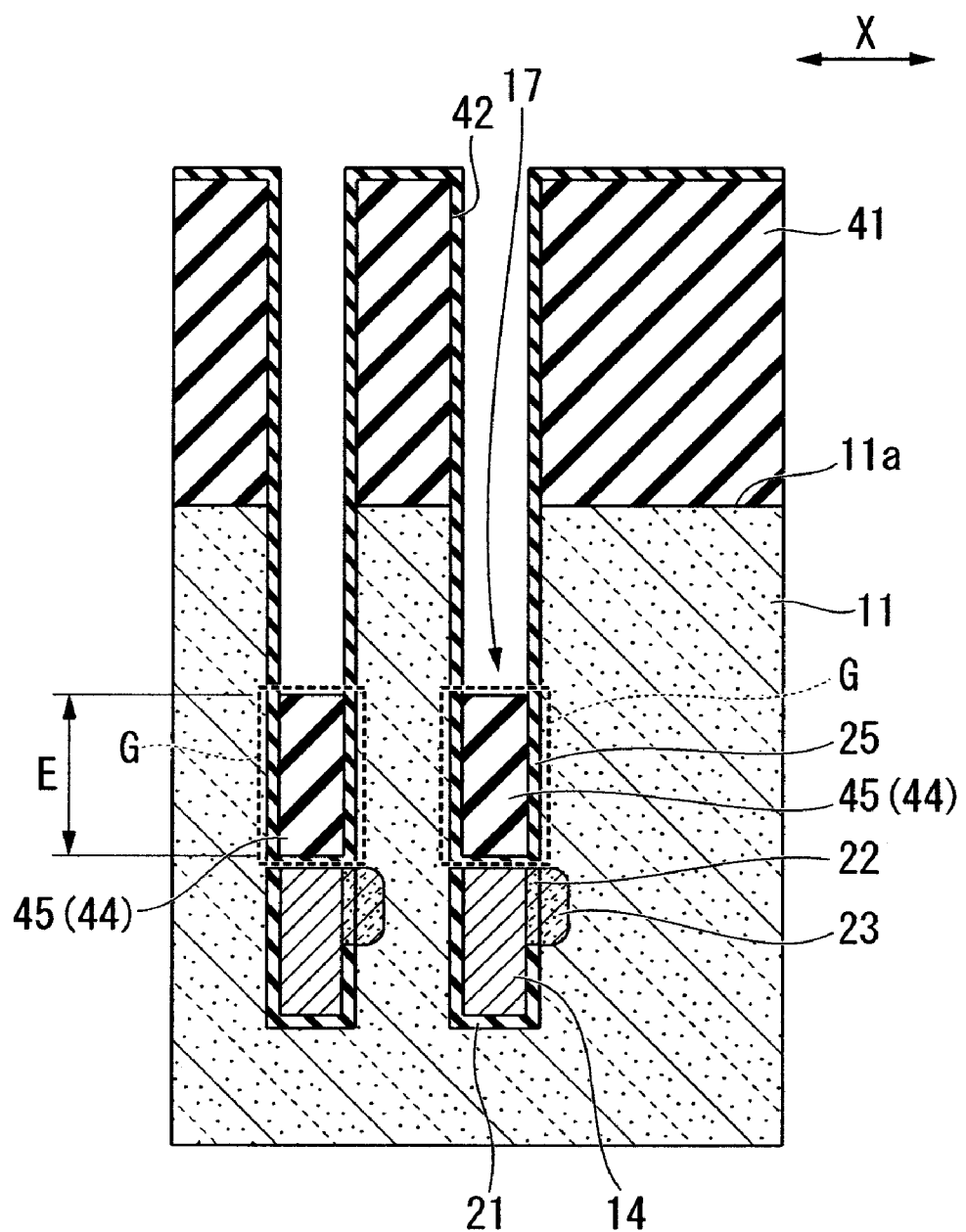
FIG. 6 is a fragmentary cross sectional elevation view, taken along an A-A line of FIG. 2, the semiconductor device in a step, subsequent to the step of FIG. 5, involved in the method of forming the semiconductor device of FIGS. 1 and 2.

Next, in the process shown in FIG. 6, a liner layer 25 which is a fourth insulating layer is formed in the first trench 17 (fourth insulating layer forming process).

The liner layer 25 is formed so as to cover the side surfaces of the first trench 17, an upper surface of the third insulating layer 21, an upper surface of the bit contact 22, and upper surface of the bit line 14. As the liner layer 25, for example, a $Si_3N_4$ layer may be used.

Next, a first SOD layer 44, which is a base material layer of a first insulating layer 45 being described below, having insulating properties is filled in the first trench 17 by a spinner method (first SOD layer forming process). The first SOD layer 44 is formed using a spin coating apparatus (coating apparatus).

As shown in FIG. 6, the first SOD layer 44 is buried in a portion of the first trench 17. However, the first SOD layer 44 of this process fills the first trench 17.

In this way, since a material of the first SOD layer 44 that is better in the gap-filling property than other insulating layers is buried in the first trench 17 having a high aspect ratio as a material of the first insulating layer 45, it is possible to suppress to generate a void.

As the material of the first SOD layer 44, for example, polysilazane may be used. Polysilazane is a polymer material that is also referred to as a silazane-type polymer that has a group of "—$(SiH_2—NH)$—" as an elementary unit. When used, polysilazane is dissolved in a solvent such as xylene, di-n-butylether, or the like. Polysilazane also contains a material where hydrogen is substituted by a functional group such as a methoxy group.

In the present embodiment, the case in which polysilazane is used as the material of the first SOD layer 44 has been described as an example.

Next, the first SOD layer 44 buried in the first trench 17 is modified at high temperature using the diffusion furnace, and is thereby abnormally oxidized, thus forming the first insulating layer 45 (first modifying process).

The following descriptions will be concerned with the natures of the abnormal oxidation process and the non-abnormal oxidation process.

The word "abnormal oxidation" may typically refer to a process causing a phenomenon that a surface of the SOD layer is modified while an inner part of the SOD layer is not modified. A typical example of the abnormal oxidation may be, but is not limited to, a thermal oxidation at a high temperature. The temperature of the thermal oxidation may depend on the SOD layer. A typical example of the material of the SOD layer may include, but is not limited to, polysilazane. The temperature of the thermal oxidation to an SOD layer of polysilazane is equal to or higher than 550° C.

The word "non-abnormal oxidation" may typically refer to another process causing another phenomenon that not only a surface of the SOD layer but also the other parts of the SOD layer is modified. The non-abnormal oxidation is performed at a lower temperature than that of the abnormal oxidation. A typical example of the non-abnormal oxidation may be, but is not limited to, another thermal oxidation at a lower temperature. The temperature of the other thermal oxidation may also depend on the SOD layer. A typical example of the material of the SOD layer may include, but is not limited to, polysilazane. The temperature of the other thermal oxidation to an SOD layer of polysilazane is equal to or higher than 400° C., and lower than 550° C., more typically lower than 500° C.

In typical cases, the abnormal oxidation is carried out to the SOD layer before the non-abnormal oxidation is carried out to the SOD layer. The SOD layer is subjected to the abnormal oxidation and a surface of the SOD layer is modified, while an inner part of the SOD layer is not modified. The modified surface of the SOD layer is removed before carrying out the non-abnormal oxidation. The SOD layer free of any modified surface is then subjected to the non-abnormal oxidation and not only the surfaces of the SOD layer but also the inner part of the SOD layer are unmodified.

In the embodiment, the abnormal oxidation is carried out to a first SOD layer and a surface of the first SOD layer is modified, while an inner part of the first SOD layer is not modified. The modified surface of the first SOD layer is removed. The first SOD layer has an unmodified surface. Then, the second SOD layer is formed on the unmodified surface of the first SOD layer. The first SOD layer and a second SOD layer are then subjected to the non-abnormal oxidation. By the non-abnormal oxidation, the second SOD layer is modified while the first SOD layer is unmodified. Carrying out the abnormal oxidation to the first SOD layer will give the first SOD layer a resistance to modification such that the first SOD layer is not modified by the non-abnormal oxidation. If the first SOD layer were not subjected to the abnormal oxidation, the first SOD layer would have no such resistance to modification and would be modifiable by the non-abnormal oxidation.

The following descriptions will be back to illustrative examples of the abnormal oxidation process and the non-abnormal oxidation process.

In the first modifying process, the modification is performed at a temperature equal to or higher than 550° C.

Subsequently, after the first modifying process, a process gas needed to modify the first SOD layer 44 in the diffusion furnace used in the first modifying process is diluted, thereby stopping modification of the first SOD layer 44 (first modification stopping process).

After the first modification stopping process, the first insulating layer 45 is annealed in a water vapor-free atmosphere using the diffusion furnace used in the first modification stopping process (first annealing process).

After the first annealing process, the first insulating layer 45 is etched-back. Thereby, as shown in FIG. 6, the first insulating layer 45 having a predetermined thickness E is formed in the first trench 17 that corresponds to a formation region G of a conductor (formation region of connection part 26 that is a conductor). For example, the predetermined thickness E may be set to 40 nm.

Here, before the first modifying process, the first modification stopping process, and the first annealing process are described in detail, the construction of the diffusion furnace 50 used in the first modifying process, the first modification stopping process, and the first annealing process will be described.

Referring to FIG. 7, the diffusion furnace 50 is a batch vertical diffusion furnace. The diffusion furnace 50 includes a process tube 51, a wafer boat 52, an upper gas supply pipe 54, a lower gas supply pipe 55, an exhaust port 57, a water vapor source 58, and a heater 59.

The process tube 51 is a processing chamber for housing the wafer boat 52 holding a plurality of semiconductor substrates 11 and performing heat treatment on the semiconductor substrates 11. The process tube 51 has the shape of a hollow cylinder, a lower end of which is open. As a material of the process tube 51, for example, quartz glass may be used.

The wafer boat 52 is configured to be able to hold a plurality of semiconductor substrates 11 (e.g. semiconductor substrates 11, each of which has the first SOD layer 44 that is not yet modified). The wafer boat 52 is housed in the process tube 51. The wafer boat 52 is configured to be able to move up and down relative to the process tube 51 by means of an elevator that is not shown.

The upper gas supply pipe 54 is guided up to an upper portion of the process tube 51 via an introduction port (not shown) formed in a sidewall located at a lower portion of the process tube 51. A supply port 54a is formed in one end of the upper gas supply pipe 54. The supply port 54a is disposed at the upper portion of the process tube 51.

The other end of the upper gas supply pipe 54 is connected with a first supply pipe 61 through which a purge gas in which $N_2$ gas and $O_2$ gas are mixed is supplied, and is also connected with the water vapor source 58 via a second supply pipe 62.

The supply port 54a supplies the purge gas and the process gas supplied from the water vapor source 58 to the upper portion of the process tube 51.

Here, the process gas is $H_2$ gas and $O_2$ gas. The $H_2$ gas and the $O_2$ gas are transformed into water vapor (steam) by platinum catalysis performed in the water vapor source 58, and then the water vapor is supplied into the process tube 51.

The lower gas supply pipe 55 is installed at the lower portion of the process tube 51. The lower gas supply pipe 55 is connected with an inert gas supply source (not shown). The lower gas supply pipe 55 supplies inert gas source (e.g. $N_2$), which is supplied from the inert gas supply, from the lower portion of the process tube 51 to the interior of the process tube 51. The inert gas supplied into the process tube 51 is a gas that prevents the process gas supplied from the upper gas supply pipe 54 from leaking out of the process tube 51, and that prevents a bottom surface of the process tube 51 from being corroded by the process gas.

The exhaust port 57 is installed in a sidewall of the lower portion of the process tube 51. The exhaust port 57 is connected with an exhausting apparatus (not shown) via a throttle valve (not shown) for regulating a pressure in the process tube 51. The exhaust port 57 serves to exhaust the process gas, which is supplied from the supply port 54a and flows toward the exhaust port 57, out of the process tube 51.

The water vapor source 58 is an apparatus from which $N_2$ gas, $O_2$ gas, and $H_2$ gas are supplied. The water vapor source 58 is an apparatus for transforming the $H_2$ gas and the $O_2$ gas into water vapor (steam) using platinum catalysis.

The heater 59 is disposed so as to surround an outer circumference of the process tube 51. The heater 59 serves to heat the process gas supplied into the process tube 51 to a predetermined temperature.

In the diffusion apparatus 50 constructed as described above, when the water vapor heated to a predetermined temperature by the heater 59 passes through gaps between the semiconductor substrates 11 supported on the wafer boat 52, the corresponding process gas acts with polysilazane of which the SOD layer is formed, thereby modifying the SOD layer so as to become a solid layer that includes silicon oxide as a main component.

Specific examples of the first modifying process, the first modification stopping process, and the first annealing process, which are performed using the diffusion furnace 50 shown in FIG. 7, will be described with reference to FIG. 8. In FIG. 8, the case in which the $H_2$ gas and the $O_2$ gas are used as the process gas, and where the $N_2$ gas is used as carrier gas and purge gas will be described as an example.

When a first heat treatment shown in FIG. 8 begins to be performed, a plurality of semiconductor substrates 11, each of which has the first SOD layer 44 that is not yet modified, are placed on the wafer boat 52 from a load lock chamber (not shown). A residual (e.g. gas) remaining in the process tube 51 that is maintained at a temperature of 150° C. (entry furnace temperature) is exhausted through the exhaust port 57.

Then, the wafer boat 52 on which the plurality of semiconductor substrates 11 are placed is transferred into the process tube 51 by an elevator (not shown), and then is on standby until the temperature in the process tube 51 housing the wafer boat 52 is stabilized at 150° C.

At time $T_1$, the pressure in the process tube 51 is reduced to 50 Torr. As such, the $O_2$ gas is supplied into the process tube 51, and the temperature in the process tube 51 is raised by the heater 59. A flow rate of the $O_2$ gas may be set to, for instance, a range of 10 to 20 standard liters per minute (SLM). Further, the period of time between the start time and time $T_1$ may be set to, for instance, 2 hours.

Then, at time $T_2$ when the temperature in the process tube 51 reaches 600° C., the pressure in the process tube 51 is raised to 400 Torr in the state in which the temperature in the process tube 51 is maintained at 600° C.

In the period of time between time $T_2$ and time $T_3$, in the state in which the temperature in the process tube 51 is maintained at 600° C., the $O_2$ gas and the $H_2$ gas are supplied to the water vapor source 58 (e.g. at a flow rate of 10 to 20 SLM), thereby generating water vapor. The water vapor is supplied into the process tube 51 via the upper gas supply pipe 54, and the first SOD layer 44 formed on each of the plurality of semiconductor substrates 11 is modified by steam oxidation and is subjected to abnormal oxidation, thereby forming the first insulating layer 45 (first modifying process).

The processing time of the first modifying process (the period of time between time $T_2$ and time $T_3$) may be set to, for instance, 2 hours.

In this way, the first SOD layer 44 is subjected to sharp steam oxidation at a high temperature of 600° C., and thereby the abnormal oxidation is carried out to the first SOD layer 44. For this reason, only the vicinity of the surface of the first SOD layer 44 is modified, and the inner part of the first SOD layer 44 is not modified.

As such, the first insulating layer 45 becomes weak and unstable, and has weak resistance to a wet etching solution (e.g. an HF solution).

Thereby, the first insulating layer 45 has a property that it has a faster wet etch rate than the SOD layer to which the abnormal oxidation is not carried out.

Further, since the abnormal oxidation is carried out to the first insulating layer 45, its quality is not modified even if another heat treatment is performed. Namely, carrying out the abnormal oxidation to the first SOD layer will give the first SOD layer a resistance to modification such that the first SOD layer is not modified by the non-abnormal oxidation.

As a typical SOD layer, an SOD layer that is modified by the steam oxidation at a temperature of 400° C. or higher may be selected.

Further, as a typical SOD layer, an SOD layer is abnormally oxidized by the steam oxidation at a high temperature, for example, equal to or higher than 550° C. when the SOD layer has not been oxidized by the steam oxidation at a low temperature, for example, equal to or lower than 550° C.

Subsequently, in the period of time between time $T_3$ and time $T_4$, supply of the process gas stops, and the $H_2$ gas which is the purge gas, is supplied into the process tube 51 to dilute a concentration of the process gas. Thereby, the modification of the first SOD layer 44 is stopped (first modification stopping process).

The processing time of the first modification stopping process (the period of time between time $T_3$ and time $T_4$) may be set to, for instance, 30 minutes.

The pressure in the process tube 51 may be reduced, and the process gas remaining in the process tube 51 may be exhausted, thereby stopping the modification of the first SOD layer 44.

In the period of time between time $T_4$ and time $T_5$, the pressure in the process tube 51 is set to a normal pressure (atmospheric pressure), and the $N_2$ gas is supplied into the process tube 51. In this state (under nitrogen atmosphere), the first insulating layer 45 is annealed at temperature of 600° C. (first annealing process).

The processing time of the first annealing process (the period of time between time $T_4$ and time $T_5$) may be set to, for instance, 30 minutes.

Subsequently, in the period of time between time $T_5$ and time $T_6$, the temperature in the process tube 51 is dropped, thereby reducing the temperature in the process tube 51 from 600° C. to 150° C.

The period of time between time $T_5$ and time $T_6$ may be set to, for instance, 15 minutes.

Afterwards, the semiconductor substrates 11 are taken out of the process tube 51, and are cooled until the temperature of the semiconductor substrates 11 reaches room temperature. Thereby, the processing is terminated.

Figure 9:
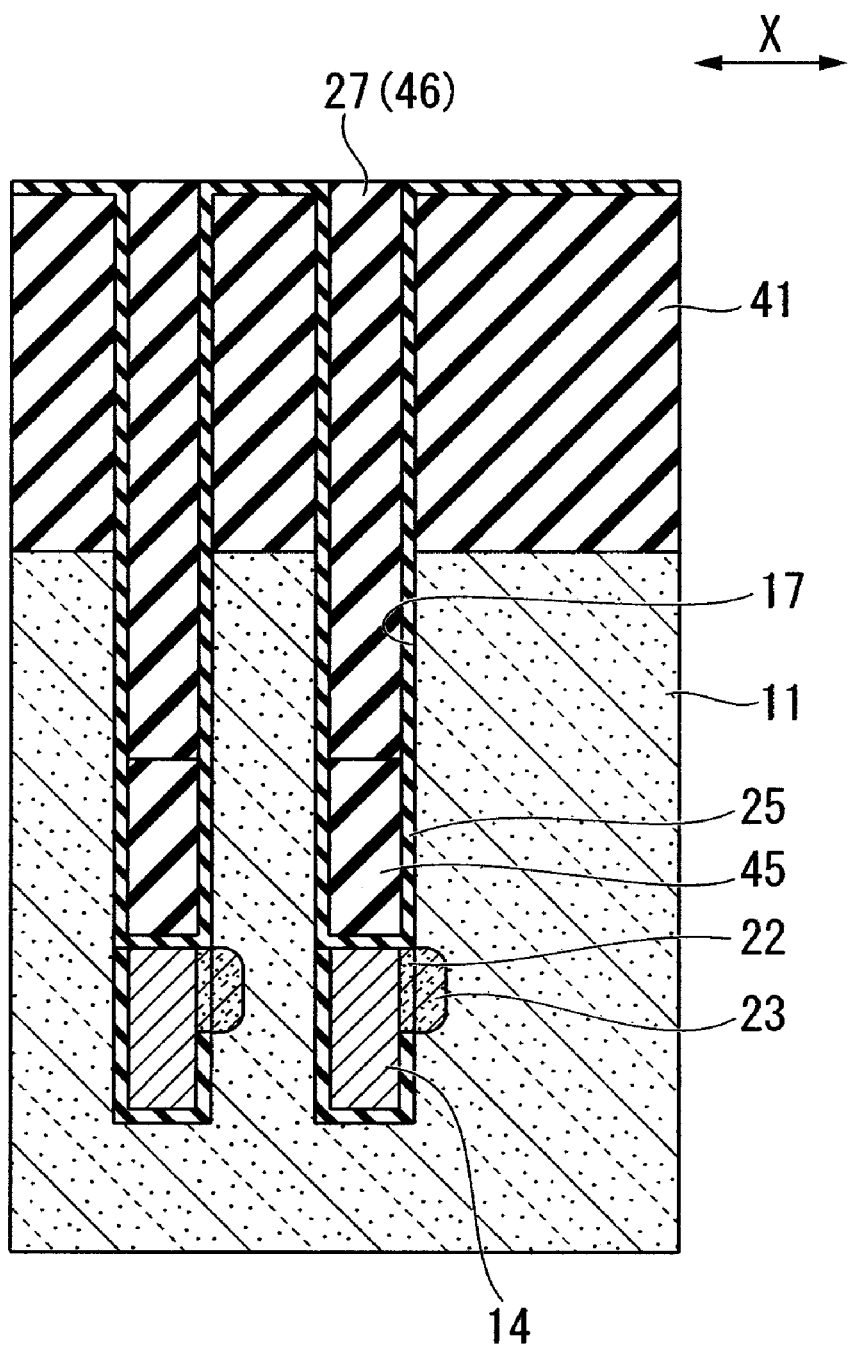
FIG. 9 is a fragmentary cross sectional elevation view, taken along an A-A line of FIG. 2, the semiconductor device in a step, subsequent to the step of FIG. 6, involved in the method of forming the semiconductor device of FIGS. 1 and 2.

In the process shown in FIG. 9, a second SOD layer 46, which is a base material layer of the second insulating layer 27, is buried in the first trench 17 by a spinner method (second SOD layer forming process). The second SOD layer 46 is formed using a spin coating apparatus (coating apparatus).

In this manner, the second SOD layer 44, which is better in the filling property than other insulating layers, is buried in the first trench 17 having a high aspect ratio, so that it is possible to suppress to generate a void in the second insulating layer 27.

As a material of the second SOD layer 46, the same material as the aforementioned first SOD layer 44 (in the case of the present embodiment, polysilazane) may be used.

Although not shown, in this process of FIG. 9, the second SOD layer 44 is formed so as to cover the liner layer 25.

The second SOD layer 46 buried in the first trench 17 is modified under an atmosphere where the water vapor is not generated at a temperature that is lower than the temperature of the first modifying process and at which the abnormal oxidation does not carried out (a temperature equal to or less than 550° C.), using the diffusion furnace 50 shown in FIG. 7 (second modifying process, that is, the non-abnormal oxidation).

The temperature of the second modifying process may be set to, for instance, a range from 400° C. to 500° C.

After the second modifying process, the process gas necessary to modify the second SOD layer 46 is diluted in the diffusion furnace 50, thereby stopping the modification of the second SOD layer 46 (second modification stopping process).

After the second modification stopping process, the second insulating layer 27 is annealed under a water vapor-free atmosphere at a temperature that is higher than the temperature of the second modifying process (e.g. 600° C.), using the diffusion furnace 50 (second annealing process).

After the second annealing process is terminated, the modified second insulating layer 27 is polished by chemical mechanical polishing (CMP) until the liner layer 25 is exposed. Thereby, the structure shown in FIG. 9 is formed.

Specific examples of the second modifying process, in which the second modification stopping process and the second annealing process are performed using the diffusion furnace 50 shown in FIG. 7, will be described with reference to FIG. 10. In FIG. 10, the case in which the $H_2$ gas and the $O_2$ gas are used as the process gas, and where the $N_2$ gas is used as carrier gas and purge gas will be described as an example.

When a second heat treatment shown in FIG. 10 begins to be performed, a plurality of semiconductor substrates 11, on each of which the second SOD layer 46 is formed, are placed on the wafer boat 52 from a load lock chamber (not shown). A residual (e.g. gas) remaining in the process tube 51 that is maintained at a temperature of 150° C. (entry furnace temperature) is exhausted through the exhaust port 57.

Then, the wafer boat 52 on which the plurality of semiconductor substrates 11 are placed is transferred into the process tube 51 by an elevator (not shown), and then is on standby until the temperature in the process tube 51 housing the wafer boat 52 is stabilized at 150° C.

At time $T_1$, the pressure in the process tube 51 is reduced to 50 Torr. As such, the $O_2$ gas is supplied into the process tube 51, and the temperature in the process tube 51 is raised by the heater 59. A flow rate of the $O_2$ gas may be set to, for instance, a range of 10 to 20 SLM. Further, the period of time between the start time to time $T_1$ may be set to, for instance, 2 hours.

Then, at time $T_2$ when the temperature in the process tube 51 reaches 400° C., the pressure in the process tube 51 is raised to 400 Torr in the state where the temperature in the process tube 51 is maintained at 400° C.

In the period of time between time $T_2$ and time $T_3$, in the state where the temperature in the process tube 51 is maintained at 400° C., the $O_2$ gas and the $H_2$ gas are supplied to the water vapor source 58 (e.g. at a flow rate of 10 to 20 SLM), thereby generating water vapor. The generated water vapor is supplied into the process tube 51 via the upper gas supply pipe 54, and thereby the second SOD layer 46 formed on the plurality of semiconductor substrates 11 is subjected to steam oxidation In other words, a first modification is carried out to the second SOD layer 46 at 400° C., which is lower than the temperature (550° C.) at which the abnormal oxidation is carried out to the SOD layer. Namely, the non-abnormal oxidation is performed to the second SOD layer 46. As such, the abnormal oxidation is not carried out to the second SOD layer 27 in the first modification.

The processing time of the first modification of the second SOD layer 46 (the period of time between time $T_2$ and time $T_3$) may be set to, for instance, 30 minutes.

Subsequently, in the period of time between time $T_3$ and time $T_4$, supply of the process gas (in this case, the $H_2$ gas and the $O_2$ gas) is stopped, and the pressure in the process tube 51 is set to a normal pressure (atmospheric pressure).

In the period of time between time $T_4$ and time $T_5$, the $O_2$ gas is supplied into the process tube 51, and the interior of the process tube 51 is under oxygen atmosphere. At this time, a supply rate of the $O_2$ gas may be set to, for instance, a range from 20 to 30 SLM. The period of time between time $T_4$ and time $T_5$ may be set to, for instance, 30 minutes.

Subsequently, in the period of time between time $T_5$ and time $T_6$, the $H_2$ gas and the $O_2$ gas are supplied to the water vapor source 58 (e.g. at a flow rate of 10 to 20 SLM), thereby generating water vapor. The generated water vapor is supplied into the process tube 51, and performs steam oxidation on the second SOD layer 46 (the SOD layer modified once at 400° C.) formed on the plurality of semiconductor substrates 11, thereby forming the second insulating layer 27.

That is, a second modification is carried out to the second SOD layer 46, which has been modified once at 400° C., at 500° C., which is lower than the temperature (550° C.) at which the abnormal oxidation is carried out to the SOD layer. In other words, the non-abnormal oxidation is carried out to the second SOD layer 46 at 500° C. Hence, the abnormal oxidation is not carried out to the second SOD layer 46 in the second modification.

The processing time of the second modification of the second SOD layer 46 (the period of time between time $T_5$ and time $T_6$) may be set to, for instance, 30 minutes.

In this manner, the steam oxidation is carried out to the second SOD layer 46 at 400° C. which is a lower limit of the temperature at which the SOD layer is modified. The steam oxidation is then carried out to second SOD layer 46 at 500° C. which is lower than the temperature at which the abnormal oxidation is carried out to the SOD layer (550° C.). Thereby, the second SOD layer 46 is modified in entirety or the majority thereof, so that the second insulating layer 27 can be formed into a dense layer.

The two-step modifying process corresponds to the second modifying process.

In the period of time between time $T_6$ and time $T_7$, supply of the process gas into the process tube 51 stops, and the $N_2$ gas (purge gas) is supplied into the process tube 51, thereby diluting a concentration of the process gas, and stopping the modification of the second SOD layer 46 (second modification stopping process).

At this time, the pressure in the process tube 51 may be reduced, and thereby the gas remaining in the process tube 51 may be exhausted through the exhaust port 57.

At time $T_7$, the temperature in the process tube 51 is regulated to 600° C., and then the $N_2$ gas is supplied into the process tube 51. Thereby, the semiconductor substrates 11, on each of which the second insulating layer 27 has been formed, are annealed under nitrogen atmosphere for 30 minutes (second annealing process).

In this way, the second insulating layer 27 is annealed at a temperature (600° C.) that is higher than the temperature of the second modification using a water vapor atmosphere, so that the second insulating layer 27 can have uniform quality. The second annealing process may be set to a high temperature similar to the temperature at which the first modification process is performed.

The second insulating layer 27 formed by this method can have stronger resistance to a wet etching solution (e.g. an HF solution), compared to the first insulating layer 45.

Subsequently, in the period of time between time $T_8$ and time $T_9$, the temperature in the process tube 51 is dropped, thereby reducing the temperature in the process tube 51 from 600° C. to 150° C. The period of time between time $T_8$ and time $T_9$ may be set to, for instance, 50 minutes.

Afterwards, the semiconductor substrates 11 are taken out of the process tube 51, and are cooled until the temperature of the semiconductor substrates 11 reaches room temperature. Thereby, the processing is terminated.

After the structure shown in FIG. 9 is formed, in the process shown in FIG. 11, a second trench 18, which has a plurality of X-directional trenches 65 and a pair of Y-directional trenches 66 and 67, is formed as shown in FIG. 12. Thereby, a plurality of pillars 13 surrounded by the first and second trenches 17 and 18 are formed (pillar forming process).

As shown in FIG. 12, the X-directional trenches 65 are trenches that extend in an X direction and intersect with the first trenches 17 at substantially right angles. The Y-directional trench 66 is a trench that extends in a Y direction and connects ends of the plurality of X-directional trenches 65 located at one end of the word line 15.

As shown in FIG. 11, the second trench 18 is formed so as to reach the third insulating layers 25 disposed on the bit lines 14.

The second trench 18 constructed as described above is formed, for instance, as follows. A resist layer (not shown) for an etching process is formed over the hard mask layer 41. The resist layer has an opening exposing the upper surface of the hard mask layer 41 which corresponds to a formation region of the second trench 18. Then, the hard mask layer 41 and the semiconductor substrate 11 are etched using isotropic etching (e.g. dry etching) that uses the resist layer for the etching process as a mask. Afterwards, the resist layer for etching process is removed.

Figure 13:
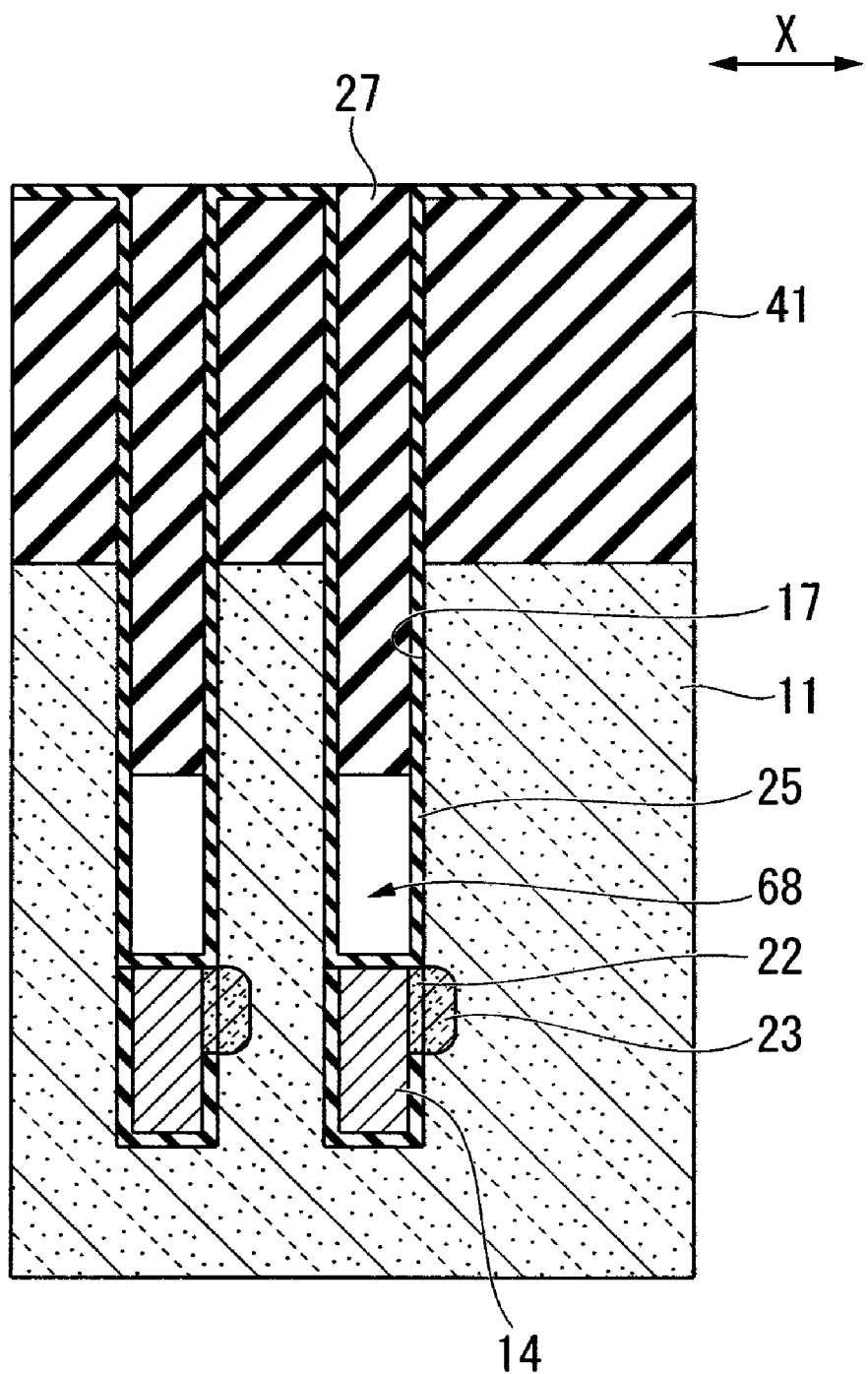
FIG. 13 is a fragmentary cross sectional elevation view, taken along an C-C line of FIG. 12, the semiconductor device in a step, subsequent to the step of FIG. 11, involved in the method of forming the semiconductor device of FIGS. 1 and 2.

In the process shown in FIG. 13, the first insulating layer 45 is removed by wet-etching, thereby forming a space 68 in the first trench 17 in which the first insulating layer 45 has been disposed (first insulating layer removing process).

At this time, as described above, the first insulating layer 45 has a faster etch rate than the second insulating layer 27 that has dense film quality and does not undergo the abnormal oxidation. As such, only the first insulating layer 44 is selectively removed. In the first insulating layer removing process, the wet-etching is promptly terminated when the first SOD layer 44 is removed.

The space 68 is formed so as to be connected with the neighboring X-directional trench 65 by the wet-etching. In other words, the space 68 is formed in a tunnel shape.

As an etching solution used for the wet etching, for example, a buffered hydrofluoric acid solution (particularly, a solution in which a hydrofluoric acid (HF) solution is mixed with an ammonium fluoride ($NH_4F$) solution) set to room temperature (particularly, 20° C. to 30° C.) may be used.

Subsequently, in the process shown in FIG. 14, thermal oxidation is performed on the semiconductor substrate 11, thereby forming a gate oxide layer 31, which is a thermal oxide layer ($SiO_2$ layer), on an exposed bottom surface of the second trench 18. The thermal oxide layer functioning as the gate oxide layer 31 may be formed with, for instance, a thickness of 3 to 6 nm.

Meanwhile, after the thermal oxide layer is formed, a surface of the thermal oxide layer may be nitrided to form the gate oxide layer 31.

Then, in the process shown in FIG. 15, a conductive layer 71, which will be processed to be the word line 15 and the connection part 26 shown in FIG. 1, is formed in the second trench 18 and the space 68 as shown in FIGS. 15 and 16 (conductive layer forming process). Thereby, the connection part 26 made of the conductive layer 71 is formed in the space 68 (conductor forming process).

The conductive layer 71 may be formed using, for instance, CVD equipment that performs layer formation under low pressure. By forming the conductive layer 71 using this equipment, the conductive layer 71 can be buried in the space 68 where it is difficult to form the conductive layer 68.

Further, as the conductive layer 71, for example, a stacked layer where a Ti layer, a TiN layer, and a W layer are sequentially stacked may be used.

Further, in the conductive layer forming process, after the conductive layer 71 is formed in the second trench 18 and the space 68, the conductive layer 71 disposed in the second trench 18 is etched-back. As a result, the upper surfaces 36a and 37a of the first and second gate electrodes 36 and 37 constituting the word line 15 are disposed above the upper surface 26a of the connection part 26. Also, an upper surface 71a of the conductive layer 71 is disposed above the upper surface 26a of the connection part 26 (conductive layer etching-back process).

In this way, the conductive layer 71 is etched-back. Thereby, the first and second gate electrodes 36 and 37 are in contact with the entire surface of the connection part 26 which is opposite to the first and second gate electrodes 36 and 37. Further, the cross-sectional areas of the first and second gate electrodes 36 and 37 are increased. As such, the resistance value of the word line 15 can be reduced.

The upper surfaces of the first and second gate electrodes 36 and 37 are disposed adjacent to the upper surfaces of the pillar 13, and thus first conductivity-type impurity are shallowly introduced into the upper surface of the pillar 13. Thereby, it is possible to easily form the upper impurity diffusion region 28.

The conductive layer 71, which is disposed in the second trench 18 after the etching-back shown in FIG. 15, may be formed with, for instance, a thickness F of 80 nm.

Figure 17:
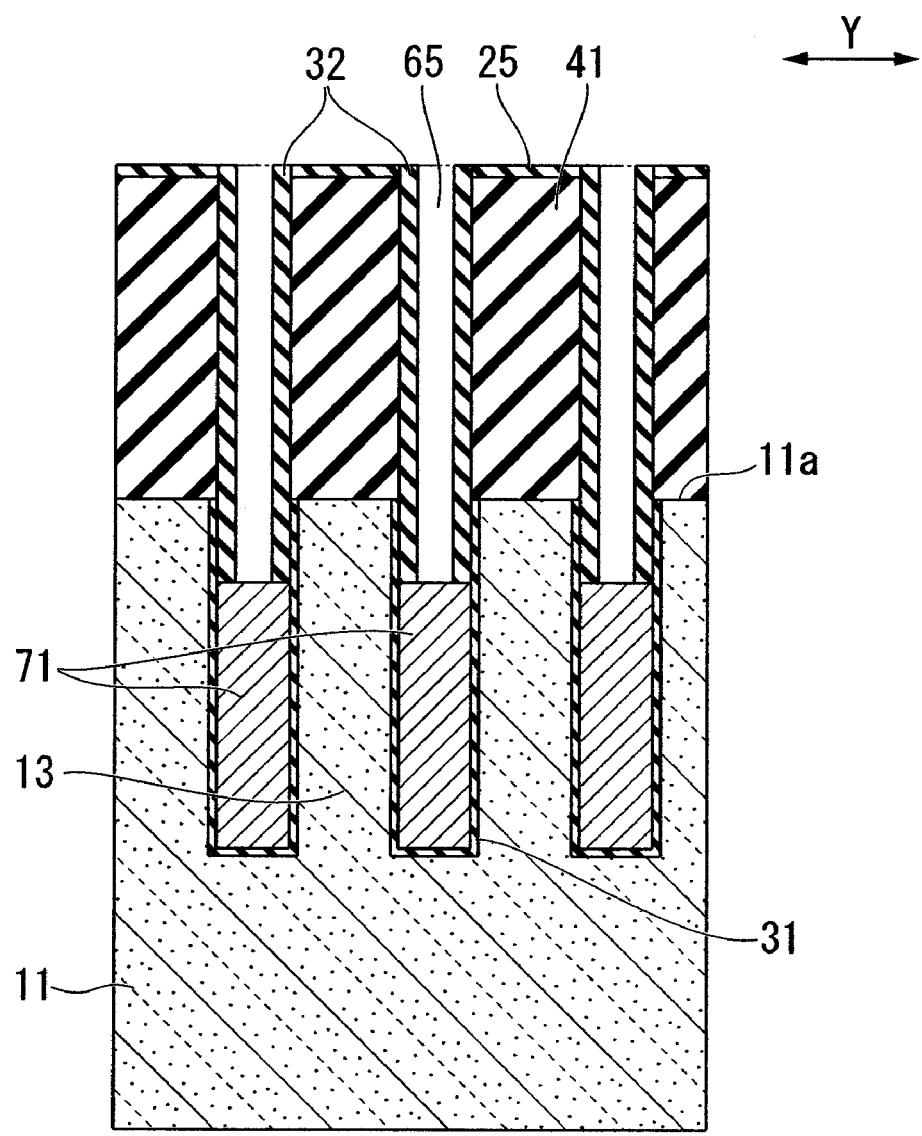
FIG. 17 is a fragmentary cross sectional elevation view, taken along a B-B line of FIG. 1, the semiconductor device in a step, subsequent to the step of FIG. 16, involved in the method of forming the semiconductor device of FIGS. 1 and 2.

In the process shown in FIG. 17, sidewall layers 32 are formed on surfaces of the hard mask layer 41 and the semiconductor wafer 11 which are exposed to the X-directional trenches 65. At this time, the sidewall layers 32 are also formed on surfaces of the hard mask layer 41 and the semiconductor wafer 11 which are exposed to the Y-directional trench 66 (not shown in FIG. 17).

In detail, for example, a $SiO_2$ layer (e.g. thickness of 10 nm) is formed so as to cover the second trench 18 by the CVD method. Then, the formed $SiO_2$ layer is etched-backed. A portion of the $SiO_2$ layer which is located in the middle portion of the upper surface of the conductive layer 71 is removed, thereby forming the sidewall layers 32 made of the $SiO_2$ layer.

Figure 18:
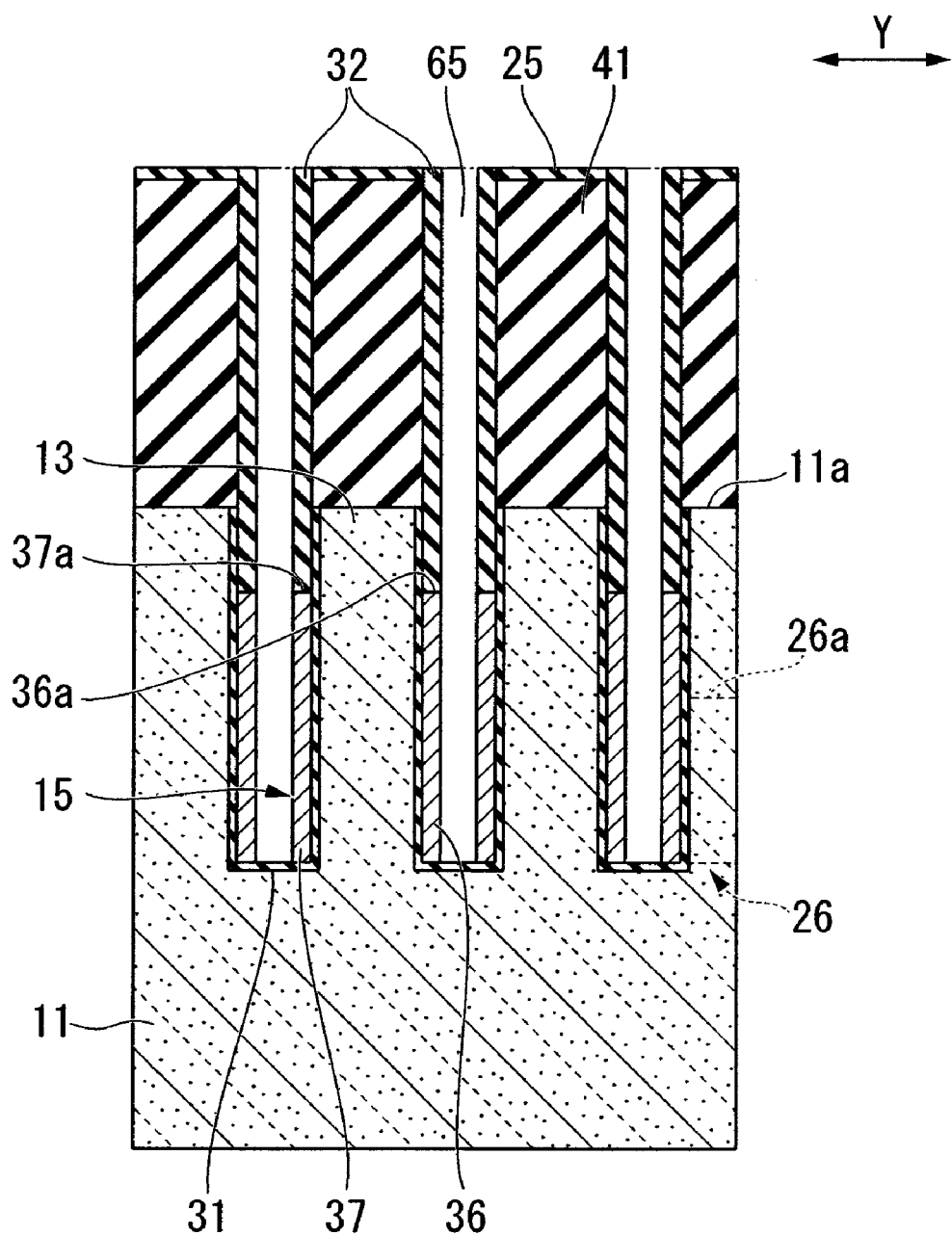
FIG. 18 is a fragmentary cross sectional elevation view, taken along a B-B line of FIG. 1, the semiconductor device in a step, subsequent to the step of FIG. 17, involved in the method of forming the semiconductor device of FIGS. 1 and 2.

Subsequently, in the process shown in FIG. 18, the conductive layer 71 which is not covered with the sidewall layers 32 is removed by anisotropic etching (e.g. dry etching) using the sidewall layers 32 as a mask as shown in FIGS. 18 and 19. Thereby, word lines 15, each of which has a first gate electrode 36, a second gate electrode 37, and a connection part 38 is formed while a dummy pattern 73 that is disposed so as to surround the plurality of word lines and has the shape of a frame when viewed from the top is formed (etching process).

At this time, the conductive layer 71 is etched until the gate oxide layer 31 is exposed. The first and second gate electrodes 36 and 37 are formed by removing the middle portion of the conductive layer 71 disposed in each X-directional trench 65 by means of etching, and dividing the conductive layer 71 into two parts.

Thereby, as shown in FIG. 19, the first gate electrode 36 is formed on a first side surface 19a of a pillar group 19 composed of a plurality of pillars 13 that are disposed in an X direction, while the second gate electrode 37 is formed on a second side surface 19a of the pillar group 19.

Even if it is considered that the anisotropic etching is performed using a resist mask, it is extremely difficult to form the resist mask having a minute width on the conductive layer 71.

Therefore, as described above, the first and second gate electrodes 36 and 37 are formed using the sidewall layers 32 as a mask for the anisotropic etching. Thereby, in comparison with the case in which the first and second gate electrodes 36 and 37 are formed using the resist mask, the first and second gate electrodes 36 and 37 can be easily formed with a desired thickness (X-directional thickness). In particular, this is effective for the case in which the dimension F of the design rule is 50 nm or less.

Here, the conductive layer forming process and the etching process is included in the gate electrode forming process.

Figure 20:
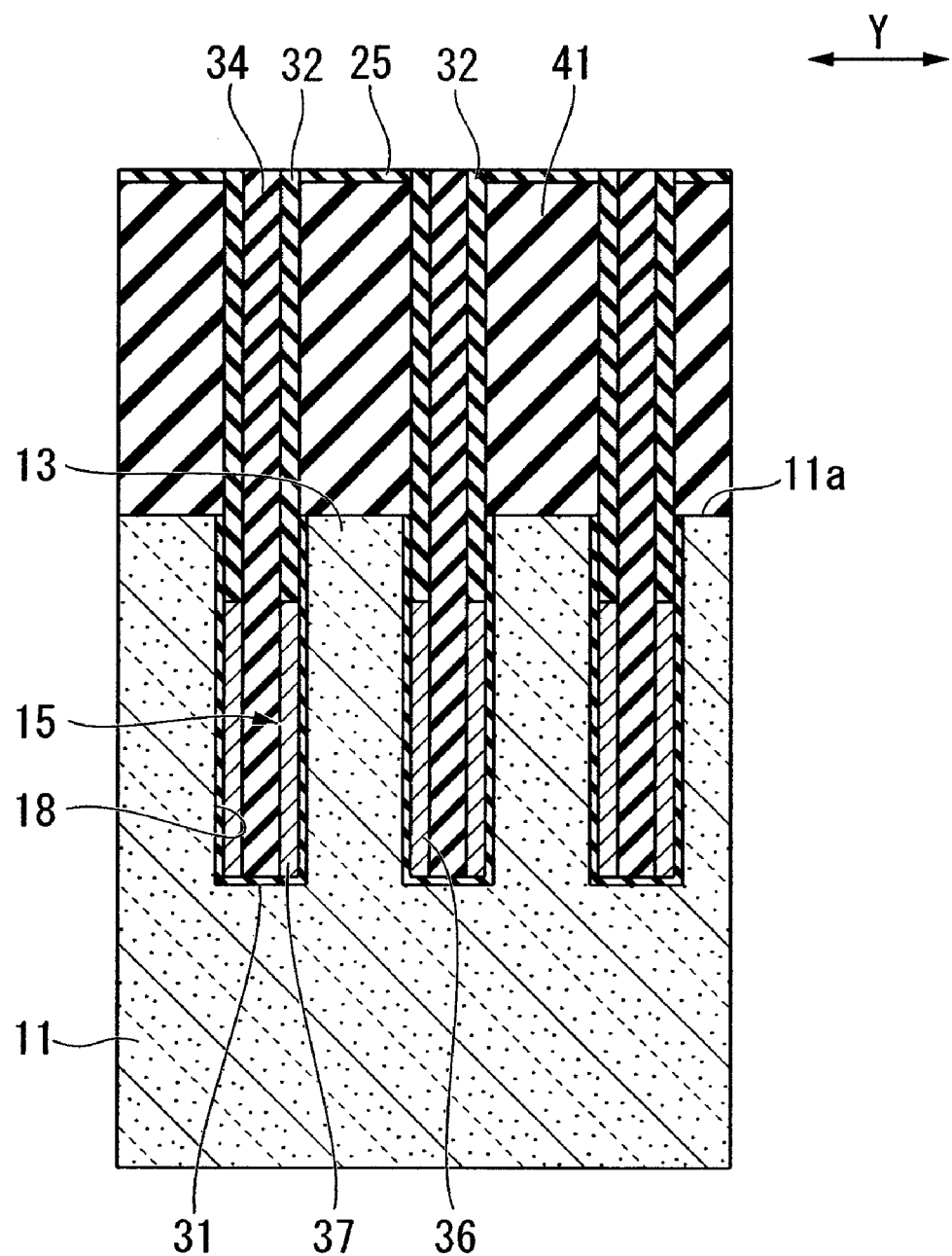
FIG. 20 is a fragmentary cross sectional elevation view, taken along a B-B line of FIG. 1, the semiconductor device in a step, subsequent to the step of FIG. 18, involved in the method of forming the semiconductor device of FIGS. 1 and 2.

Then, in the process shown in FIG. 20, the second trench 18, in which the word line 15 and the sidewall layers 32 are formed, is buried with a fifth insulating layer 34. As the fifth insulating layer 34, for example, a $SiO_2$ layer or an insulating layer formed by a spinner method may be used. When the $SiO_2$ layer is used as the fifth insulating layer 34, the fifth insulating layer 34 may be formed by, for instance, a CVD method.

Figure 21:
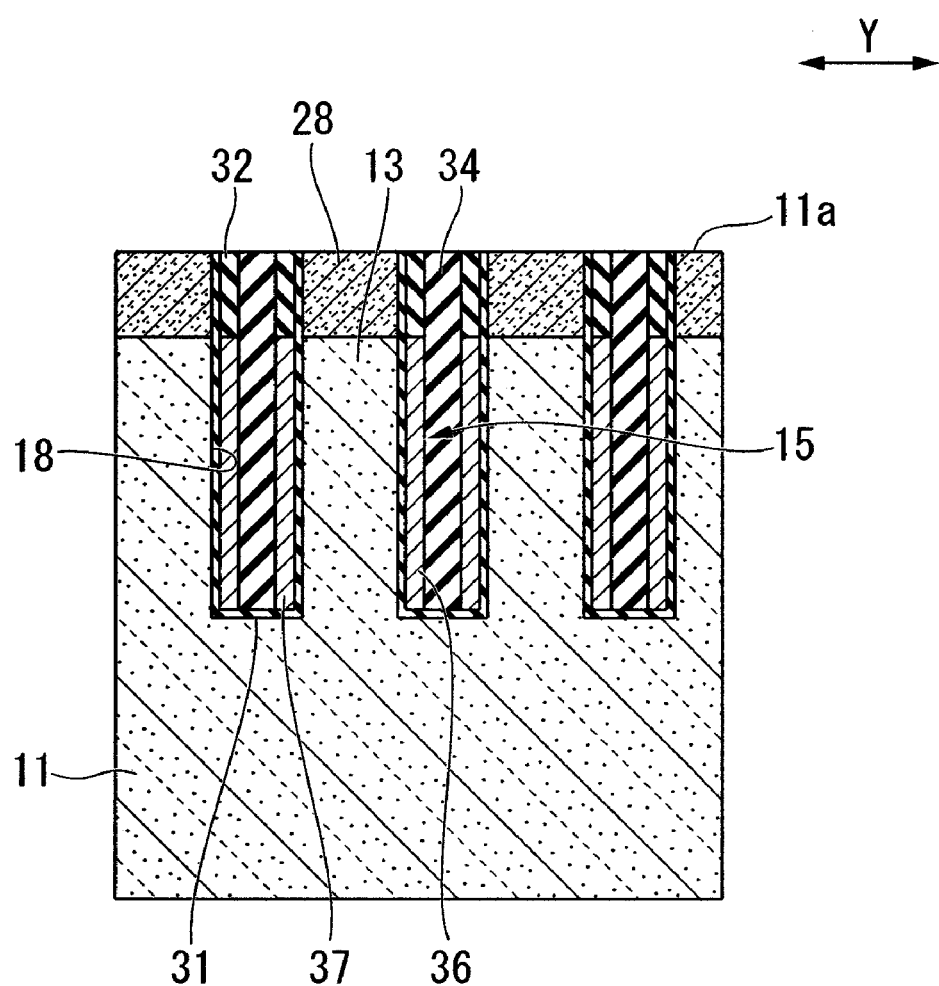
FIG. 21 is a fragmentary cross sectional elevation view, taken along a B-B line of FIG. 1, the semiconductor device in a step, subsequent to the step of FIG. 20, involved in the method of forming the semiconductor device of FIGS. 1 and 2.

In the process shown in FIG. 21, the liner layer 25 and the hard mask layer 41 are removed, thereby exposing the upper surfaces of the plurality of pillars 13.

Then, an N-type impurity (e.g. As) that is a first conductivity-type impurity is doped into the upper surfaces of the plurality of pillars 13, thereby forming the upper impurity diffusion region 28 (upper impurity diffusion region forming process).

Subsequently, the sidewall layers 32 and the fifth insulating layers 34, which are located above the surface 11a of the semiconductor substrate 11, are removed, thereby forming the surface 11a of the semiconductor substrate 11 of the structure shown in FIG. 21 into a flat plane.

Afterwards, the capacitors 16 shown in FIG. 4 are formed over the structure shown in FIG. 21 by a well-known method, thereby fabricating the semiconductor device 10 shown in FIGS. 1 through 4.

Before the capacitors 16 are formed, contact plugs (not shown), which electrically connect the capacitors 16 with the upper impurity diffusion region 28, may be formed.

Further, although a pedestal type in which the capacitor 16 uses only the outer wall of a lower electrode as an electrode is shown, a cylinder type in which only an inner wall of the lower electrode is used as an electrode, or a crown type in which both the outer wall and the inner wall of the lower electrode are used as an electrode may be used.

According to the semiconductor device fabricating method of the present embodiment, a part of the first trench 17 that is located on the connection part 26 is buried with the second insulating layer 27 formed by the spinner method. Thereby, even when an aspect ratio of the first trench 17 is high, it is possible to suppress to generate void in the second insulating layer 27 buried in the first trench 17. As such, it is possible to prevent a short circuit caused by the void of the second insulating layer 27.

Further, the first SOD layer 44 is modified at a temperature at which the abnormal oxidation is carried out (equal to or higher than 550° C.). Thereby, only the surface of the first SOD layer 44 is modified, while the inner part of the first SOD layer 44 is not modified. As such, the first insulating layer 45 is not modified again even if heat treatment of the second modifying process is performed.

Further, the second SOD layer 46 is modified step by step at a temperature (e.g. 400° C. and 500° C.) that is lower than the temperature of the first modifying process, thereby forming the second insulating layer 27. Since the second SOD layer 46 is modified in entirety or the majority thereof, the film quality of the second insulating layer 27 can be made denser than that of the first insulating layer 45.

By virtue of this, when the first insulating layer 45 is removed by wet-etching after the second insulating layer 27 is formed, only the first insulating layer 45 can be selectively removed. As such, the connection part 26 having a desired shape can be formed in a space from which the first insulating layer 45 is removed.

The present embodiment has described the case in which the processing temperature of the first modifying process is set to 600° C. as an example. However, after the first SOD layer forming process, the first SOD layer 44 may be subjected to steam oxidation at a temperature of 550° C. or higher in the beginning. In this case, it is possible to obtain the same effects as the case in which the steam oxidation is performed at a temperature of 600° C.

Further, the present embodiment has described the case in which the second modifying process is carried out by performing steam oxidation on the second SOD layer 27 at a temperature (400° C.), which is as low as possible in order to carry out the non-abnormal oxidation, in the beginning, and then performing steam oxidation on the second SOD layer 46 at a higher temperature (500° C.) than the temperature as an example. However, the temperature at which the steam oxidation is carried out to the second SOD layer 46 may be arbitrarily set within a range from 400° C. to 500° C.

In the second modifying process, the temperature may be raised in a stepwise manner so that the second SOD layer can be formed as a layer having resistance to an HF solution. Specifically, the steam oxidation is carried out to the second SOD layer 46 at a temperature (400° C.) in order to carry out the non-abnormal oxidation in the beginning, and then performing steam oxidation on the second SOD layer 46 at a higher temperature (500° C.) than the temperature (by raising a temperature in the stepwise manner to perform steam oxidation). In the present embodiment, the case in which the temperature is raised in two steps is exemplified. However, the temperature may be raised in three steps.

Figure 22:
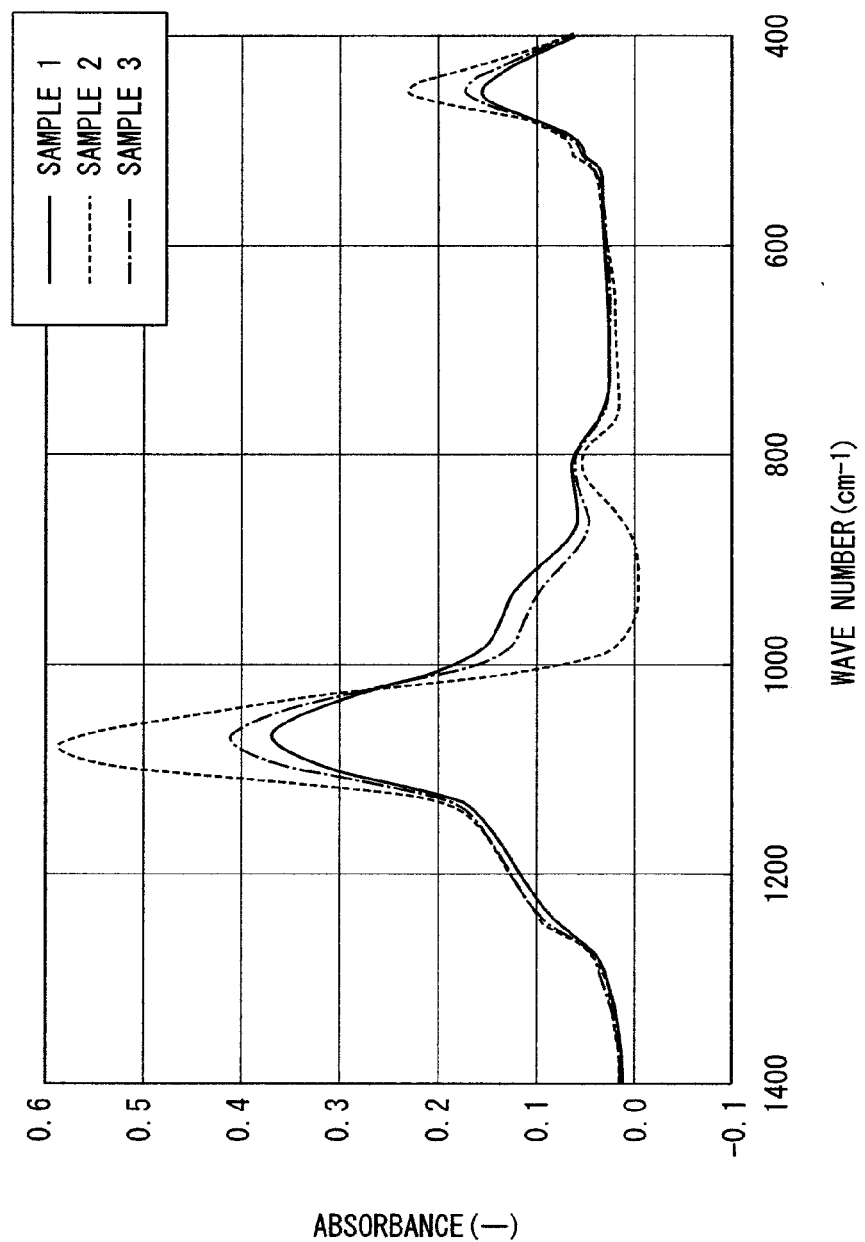
FIG. 22 is an infrared spectrum of insulating layers obtained by Fourier transform infrared spectroscopy.

FIG. 22 shows an infrared spectrum obtained by Fourier transform infrared spectroscopy. In FIG. 22, the longitudinal axis represents absorbance, and the transverse axis represents a wave number that is the reciprocal of a wavelength.

A peak, at which a value of the wave number approximates $1100\ cm^{-1}$, is based on a Si—O bond where silicon (Si) is bonded with oxygen (O).

Here, the results of analyzing the insulating layers using the Fourier transform infrared spectroscopy will be described with reference to FIG. 22. Sample 1 shows the result of the insulating layer made of the SOD layer modified by the heat treatment shown in FIG. 8. Sample 2 shows the result of the insulating layer made of the SOD layer modified by the heat treatment shown in FIG. 10. Sample 3 shows the result of the insulating layer made of the SOD layer to which the heat treatment shown in FIG. 8 is carried out and then the heat treatment shown in FIG. 10 is carried out.

It can be found from the measured results shown in FIG. 22 that, in Samples 1 through 3, a composition of the SOD layer was changed from polysilazane to a silicon oxide by modification based on the heat treatment.

Further, it can be found that, since the peak adjacent to $1100\ cm^{-1}$ of Sample 1 had a lower height and a wider width compared to that of Sample 2, the intensity of a Si—O bond was weak.

Also, the peak adjacent to $1100\ cm^{-1}$ of Sample 3 did not have a definite difference in shape, compared to that of Sample 1.

It can be found from this result that the insulating layer of Sample 3 was not a layer that is being modified but a layer that has been modified, and that the film quality as silicon oxide was substantially equal to that of the SOD layer of Sample 1.

That is, it can be found that, when second heat treatment conditions were performed on the insulating layer of Sample 1, the SOD layer of Sample 1 did not have the same film quality as the SOD layer of Sample 2.

Generally, the film quality of the SOD layer is determined by the overall heat history to which the SOD layer is applied. As such, for example, when two SOD layers are stacked in a vertical direction, the lower SOD layer formed first is influenced by heat treatment applied to the upper SOD layer formed over the lower SOD layer. For this reason, for example, when the modification of the lower SOD layer is stopped halfway, the film quality of the insulating layer made of the lower SOD layer becomes equal to that of the insulating layer made of the upper SOD layer. Hence, it is difficult to selectively etch only the lower insulating layer using wet etching without etching the upper insulating layer.

In the present embodiment, it can be found from the measured results shown in FIG. 22 that, since the modification of the first SOD layer 44 (i.e. the SOD layer disposed at the lower layer) heat-treated in the first heat treatment was completed, the modified first SOD layer 44 was no longer modified by the influence of the second heat treatment performed on the second SOD layer 27.

Figure 23:
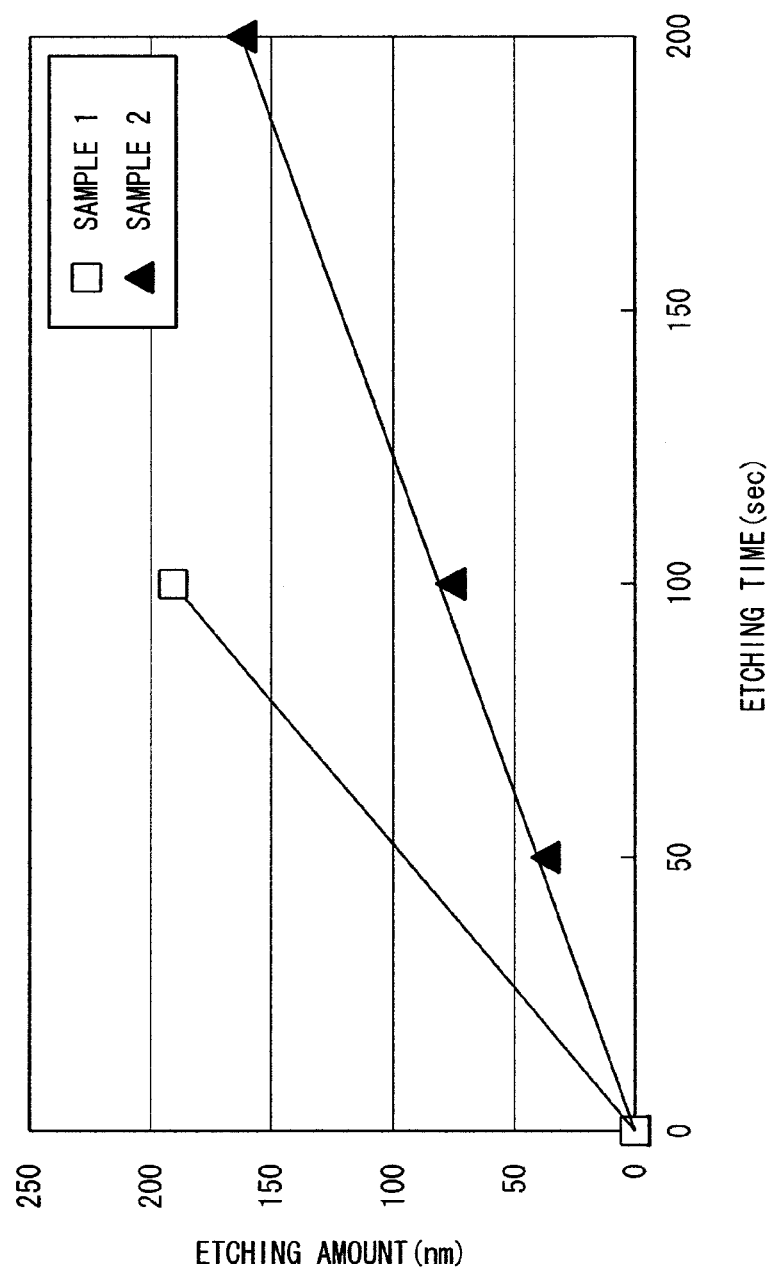
FIG. 23 is a figure showing an etching amount according to time when the insulating layers of Samples 1 and 2 shown in FIG. 22 are etched.

FIG. 23 shows an etching amount according to time when the insulating layers of Samples 1 and 2 shown in FIG. 22 are etched.

The etch rates of the insulating layers of Samples 1 and 2 will be described with reference to FIG. 23. In FIG. 23, the results of etching the insulating layer of Sample 1 and the insulating layer of Sample 2 using a buffered HF solution (particularly, a solution in which a HF solution is mixed with an NH$_4$F solution) set to room temperature (particularly, 20° C. to 30° C.) are shown.

It can be seen from the results shown in FIG. 23 that the etch rate of the insulating layer of Sample 1 (i.e. the layer that was subjected to the abnormal oxidation) was twice as fast as that of the insulating layer of Sample 2 (i.e. the layer that was not subjected to the abnormal oxidation).

Thereby, it can be found that the first insulating layer 45 (i.e. the layer that was subjected to the abnormal oxidation) disposed under the second insulating layer 27 can be selectively removed.

It is considered that an insulation layer (a silicon oxide layer) formed using a high density plasma (HDP)-CVD method that is not shown is used in place of the second insulating layer 27 applied to the semiconductor device 10 of the present embodiment.

In this case, the insulation layer formed by the HDP-CVD method is poor in the gap-filling property, compared to the SOD layer. As such, when the aspect ratio of the first trench 17 is high, the void is formed in the insulating layer, and thus the short circuit caused by the void is generated.

Thus, it is effective to use the second insulating layer 27 described in the present embodiment rather than the insulating layer formed by the HDP-CVD method.

The present embodiment can be applied to semiconductor devices and methods of fabricating the same.

As used herein, the following directional terms "forward, rearward, above, downward, vertical, horizontal, below, and transverse" as well as any other similar directional terms refer to those directions of an apparatus equipped with the present invention. Accordingly, these terms, as utilized to describe the present invention should be interpreted relative to an apparatus equipped with the present invention.

Furthermore, the particular features, structures, or characteristics may be combined in any suitable manner in one or more embodiments.

The terms of degree such as "substantially," "about," and "approximately" as used herein mean a reasonable amount of deviation of the modified term such that the end result is not significantly changed. For example, these terms can be construed as including a deviation of at least ±5 percents of the modified term if this deviation would not negate the meaning of the word it modifies.

It is apparent that the present invention is not limited to the above embodiments, but may be modified and changed without departing from the scope and spirit of the invention.

What is claimed is:

1. A method of forming a semiconductor device, the method comprising:
    forming a first spin-on-dielectric layer over a semiconductor substrate;
    carrying out an abnormal oxidation of the first spin-on-dielectric layer;
    removing a surface of the first spin-on-dielectric layer;
    forming a second spin-on-dielectric layer over the first spin-on-dielectric layer; and
    carrying out a non-abnormal oxidation of the first and second spin-on-dielectric layers to modify the second spin-on-dielectric layer without modifying the first spin-on-dielectric layer.

2. The method according to claim 1, further comprising:
    removing the first spin-on-dielectric layer.

3. The method according to claim 1, further comprising:
    carrying out a wet-etching process to etch the first and second spin-on-dielectric layers, wherein the first spin-on-dielectric layer is etched at a first etching rate, the second spin-on-dielectric layer is etched at a second etching rate, and the first etching rate is greater than the second etching rate.

4. The method according to claim 1, wherein the abnormal oxidation is carried out at a first temperature,
    wherein the non-abnormal oxidation is carried out at a second temperature lower than the first temperature.

5. The method according to claim 4, wherein the first temperature is equal to or higher than 550° C., and
    wherein the second temperature is lower than 550° C.

6. The method according to claim 1, wherein carrying out the abnormal oxidation comprises:
    carrying out the abnormal oxidation with steam,
    wherein carrying out the non-abnormal oxidation comprises:
    carrying out the non-abnormal oxidation with steam.

7. The method according to claim 1, wherein carrying out the abnormal oxidation comprises:
    supplying an oxidation process gas; and
    diluting the oxidation process gas to stop the abnormal oxidation.

8. The method according to claim 1, wherein carrying out the non-abnormal oxidation comprises:
    supplying an oxidation process gas; and
    diluting the oxidation process gas to stop the non-abnormal oxidation.

9. A method of forming a semiconductor device, the method comprising:
    forming a trench in a semiconductor substrate;
    forming a first spin-on-dielectric layer in the trench;
    carrying out an abnormal oxidation of the first spin-on-dielectric layer;
    removing a surface of the first spin-on-dielectric layer;
    forming a second spin-on-dielectric layer over the first spin-on-dielectric layer;
    carrying out a non-abnormal oxidation of the first and second spin-on-dielectric layers to modify the second spin-on-dielectric layer without modifying the first spin-on-dielectric layer;
    removing the first spin-on-dielectric layer without removing the second spin-on-dielectric layer to form a space in the trench, the space being positioned under the second spin-on-dielectric layer; and
    forming a conductor in the space.

10. The method according to claim 9, wherein removing the first spin-on-dielectric layer comprises:
    carrying out a wet-etching process to etch the first and second spin-on-dielectric layers, wherein the first spin-on-dielectric layer is etched at a first etching rate, the second spin-on-dielectric layer is etched at a second etching rate, and the first etching rate is greater than the second etching rate.

11. The method according to claim 9, wherein the abnormal oxidation is carried out at a first temperature,
    wherein the non-abnormal oxidation is carried out at a second temperature lower than the first temperature.

12. The method according to claim 11, wherein the first temperature is equal to or higher than 550° C., and wherein the second temperature is lower than 550° C.

13. The method according to claim 9, wherein carrying out the abnormal oxidation comprises:

carrying out the abnormal oxidation with steam, wherein carrying out the non-abnormal oxidation comprises:

carrying out the non-abnormal oxidation with steam.

14. The method according to claim 9, wherein carrying out the abnormal oxidation comprises:

supplying an oxidation process gas; and diluting the oxidation process gas to stop the abnormal oxidation.

15. The method according to claim 9, wherein carrying out the non-abnormal oxidation comprises:

supplying an oxidation process gas; and diluting the oxidation process gas to stop the non-abnormal oxidation.

16. A method of forming a semiconductor device, the method comprising:

forming a trench in a semiconductor substrate;

forming a bit contact on a side surface of the trench, the bit contact including a first impurity element;

forming a bit line in the trench;

forming a first spin-on-dielectric layer over the bit line in the trench;

carrying out an abnormal oxidation of the first spin-on-dielectric layer;

removing a surface of the first spin-on-dielectric layer;

forming a second spin-on-dielectric layer in contact with the first spin-on-dielectric layer;

carrying out a non-abnormal oxidation of the first and second spin-on-dielectric layers to modify the second spin-on-dielectric layer without modifying the first spin-on-dielectric layer;

removing the first spin-on-dielectric layer without removing the second spin-on-dielectric layer to form a space, the space being positioned under the second spin-on-dielectric layer;

forming a conductor in the space; and introducing a second impurity element to a surface of the semiconductor substrate, the second impurity element being the same in conductivity type as the first impurity element.

17. The method according to claim 16, wherein the abnormal oxidation is carried out at a first temperature, wherein the non-abnormal oxidation is carried out at a second temperature lower than the first temperature.

18. The method according to claim 17, wherein the first temperature is equal to or higher than 550° C., and wherein the second temperature is lower than 550° C.

19. The method according to claim 16, wherein carrying out the abnormal oxidation comprises:

carrying out the abnormal oxidation with steam, wherein carrying out the non-abnormal oxidation comprises:

carrying out the non-abnormal oxidation with steam.

20. The method according to claim 16, wherein removing the first spin-on-dielectric layer comprises:

carrying out a wet-etching process to etch the first and second spin-on-dielectric layers, wherein the first spin-on-dielectric layer is etched at a first etching rate, the second spin-on-dielectric layer is etched at a second etching rate, and the first etching rate is greater than the second etching rate.

* * * * *